(12) United States Patent
Yu et al.

(10) Patent No.: US 10,499,086 B2
(45) Date of Patent: Dec. 3, 2019

(54) VIDEO DATA ENCODING AND DECODING METHODS AND APPARATUSES

(71) Applicants: Tsinghua University, Beijing (CN); Huawei Technologies Co., Ltd., Shenzhen (CN)

(72) Inventors: Quanhe Yu, Beijing (CN); Xiaozhen Zheng, Shenzhen (CN); Jianhua Zheng, Beijing (CN); Yun He, Beijing (CN)

(73) Assignees: Tsinghua University, Beijing (CN); Huawei Technologies Co., Ltd., Shenzhen (CN)

( * ) Notice: Subject to any disclaimer, the term of this patent is extended or adjusted under 35 U.S.C. 154(b) by 247 days.

(21) Appl. No.: 15/466,666

(22) Filed: Mar. 22, 2017

(65) Prior Publication Data

US 2017/0195692 A1    Jul. 6, 2017

Related U.S. Application Data

(63) Continuation of application No. PCT/CN2015/090146, filed on Sep. 21, 2015.

(30) Foreign Application Priority Data

Sep. 23, 2014 (CN) .......................... 2014 1 0490452
Nov. 5, 2014 (CN) .......................... 2014 1 0638187

(51) Int. Cl.
*H04N 19/91* (2014.01)
*H04N 19/50* (2014.01)
(Continued)

(52) U.S. Cl.
CPC .......... *H04N 19/91* (2014.11); *H03M 7/4012* (2013.01); *H04N 19/103* (2014.11);
(Continued)

(58) Field of Classification Search
CPC ...... H04N 19/61; H04N 19/103; H04N 19/91; H04N 19/50; H03M 7/4012; H03M 7/3075
(Continued)

(56) References Cited

U.S. PATENT DOCUMENTS 4,791,403 A * 12/1988 Mitchell ............... G06F 1/0307
341/51
4,891,643 A * 1/1990 Mitchell ................ G06T 9/005
341/107
(Continued)

FOREIGN PATENT DOCUMENTS

CN          1983334 A     6/2007
CN          101848388 A   9/2010
(Continued)

*Primary Examiner* — Zaihan Jiang
(74) *Attorney, Agent, or Firm* — Leydig, Voit & Mayer, Ltd.

(57) ABSTRACT

The present application discloses video data encoding and decoding methods and apparatuses, so as to conveniently perform data encoding and decoding on video data. The method includes: arithmetic encoding, where the arithmetic encoding includes: obtaining a binary symbol of image data; and if the binary symbol is a most probable symbol (MPS), updating a first encoding interval corresponding to the MPS in a logarithm domain, and if the first updated encoding interval is less than a preset range of an arithmetic encoding interval, performing normalization processing on the first encoding interval in the logarithm domain; or if the binary symbol is a least probable symbol (LPS), updating a second encoding interval corresponding to the LPS in an original number domain, and performing normalization processing on the second encoding interval in the original number domain.

14 Claims, 6 Drawing Sheets

(51) Int. Cl.
*H04N 19/61* (2014.01)
*H04N 19/103* (2014.01)
*H03M 7/40* (2006.01)
*H03M 7/30* (2006.01)

(52) U.S. Cl.
CPC ............ H04N 19/50 (2014.11); H04N 19/61 (2014.11); *H03M 7/3075* (2013.01)

(58) Field of Classification Search
USPC .................................................. 375/240.12
See application file for complete search history.

(56) References Cited

U.S. PATENT DOCUMENTS

| | | | |
|---|---|---|---|
| 7,808,406 B2 | 10/2010 | He et al. | |
| 2006/0001557 A1* | 1/2006 | Liao | H03M 7/30 341/60 |
| 2008/0075376 A1* | 3/2008 | Wilson | H04N 19/13 382/247 |
| 2008/0118169 A1* | 5/2008 | Sohm | H03M 7/4006 382/247 |
| 2008/0154803 A1* | 6/2008 | Stein | H03M 7/4006 706/1 |
| 2008/0258947 A1 | 10/2008 | Wilson et al. | |
| 2008/0258948 A1* | 10/2008 | Stein | H03M 7/4006 341/106 |
| 2010/0054328 A1 | 3/2010 | Nozawa | |
| 2010/0127904 A1* | 5/2010 | Oxman | H03M 7/40 341/107 |
| 2010/0310065 A1* | 12/2010 | Chang | H04N 7/1675 380/28 |
| 2011/0228858 A1* | 9/2011 | Budagavi | H04N 19/70 375/240.25 |
| 2012/0299757 A1* | 11/2012 | Xu | H03M 7/4018 341/107 |
| 2013/0272373 A1* | 10/2013 | Wong | H04N 19/00 375/240.01 |
| 2015/0349796 A1* | 12/2015 | Zhou | H03M 7/4018 341/107 |

FOREIGN PATENT DOCUMENTS

| | | |
|---|---|---|
| CN | 104394418 A | 3/2015 |
| WO | WO 2008054005 A2 | 5/2008 |

* cited by examiner

VIDEO DATA ENCODING AND DECODING METHODS AND APPARATUSES

CROSS-REFERENCE TO RELATED APPLICATIONS

This application is a continuation of International Application No. PCT/CN2015/090146, filed on Sep. 21, 2015, which claims priority to Chinese Patent Application No. 201410638187.8, filed on Nov. 5, 2014 and Chinese Patent Application No. 201410490452.2, filed on Sep. 23, 2014. All of the aforementioned patent applications are hereby incorporated by reference in their entireties.

STATEMENT OF JOINT RESEARCH AGREEMENT

The subject matter and the claimed application were made by or on the behalf of Tsinghua University, of Haidian District, Beijing, P. R. China and Huawei Technologies Co., Ltd., of Shenzhen, Guangdong Province, P. R. China, under a joint research agreement titled "Research and Development of Next Generation Video Coding Standards and Technologies." The joint research agreement was in effect on or before the claimed application was made, and that the claimed application was made as a result of activities undertaken within the scope of the joint research agreement.

TECHNICAL FIELD

Embodiments of the present application relate to the communications technologies, and in particular, to video encoding and decoding processing methods and apparatuses.

BACKGROUND

In video encoding/decoding, to reduce, as much as possible, a bandwidth needed to transfer video data, the video data may be compressed by using multiple video compression methods. The video compression methods include: intra-frame compression and inter-frame compression. Currently, an inter-frame compression method based on motion estimation is mostly used. Specifically, a process in which an image encoding end compresses and encodes an image by using the inter-frame compression method includes: The encoding end divides a to-be-encoded image block into several sub-image blocks whose sizes are equal, then for each sub-image block, searches a reference image for an image block that most matches the current sub-image block, as a prediction block, then subtracts a corresponding pixel value of the prediction block from a corresponding pixel value of the sub-image block to obtain a residual, performs entropy encoding on a value obtained by transforming and quantizing the residual, and finally encodes encoded data such as a bit stream obtained by means of the entropy encoding and motion vector information. At an image decoding end, entropy decoding is first performed on the bit stream obtained by means of the entropy encoding, to obtain the encoded data such as the corresponding residual, and the corresponding motion vector information; and then the corresponding matching image block (that is, the foregoing prediction block) is obtained from the reference image according to the motion vector information, and then each pixel value in the matching image block and a corresponding pixel value in the residual are added to obtain each pixel value in the current sub-image block. The intra-frame prediction refers to that an image block is predicted by using information in a current image to obtain a prediction block, an encoding end obtains a pixel corresponding to the prediction block according to a prediction mode, a prediction direction, and a pixel value around the image block, the pixel of the prediction block is subtracted from a pixel of the image block to obtain a residual, and the residual is subjected to transform, quantization and entropy encoding and then written to a code stream; and a decoding end parses the code stream, a residual block is obtained after entropy decoding, inverse quantization, and inverse transform are performed on the code stream, the decoding end obtains the prediction block according to the prediction mode, the prediction direction, and the pixel value around the image block, and a pixel of the residual block and the pixel of the prediction block are added to obtain a reconstructed image block.

Currently, an encoding/decoding method frequently used in an entropy encoding/entropy decoding module is an arithmetic encoding/decoding technology, and a basic idea of the arithmetic encoding/decoding is to encode a signal source by using a real number in [0, 1). Theoretically, a fixed interval may be divided into several sub-intervals according to probabilities of stable and independent signal source symbol sequences, and any signal source symbol sequence may be denoted by using a decimal in a sub-interval corresponding to the signal source symbol sequence. When a sequence length tends to be infinite, encoding efficiency tends to be a signal source entropy rate. A basic implementation framework of the arithmetic encoding/decoding is as follows:

1. An encoded element is transformed into a binary symbol string: data of to-be-encoded syntactic elements, for example, an image unit mode, an intra-frame prediction mode, a residual coefficient, and a motion vector, is generally not binarized, while an arithmetic encoding engine can process only a binary symbol, and therefore before the syntactic elements are encoded, binarization processing needs to be performed on these syntactic elements. The so-called binarization process is a process of transforming a multivalue symbol into a binary symbol string. For example, when a value of the image unit mode cu type is 3, a binary symbol string '1001' of the image unit mode may be obtained by performing binarization. The binarization process may be considered as a variable-length encoding process, and different binary symbol strings are generally obtained for same values of syntactic elements that are not common.

2. An arithmetic encoding interval is updated according to a value of a binary symbol and a probability value corresponding to the binary symbol to encode the binary symbol. Two basic parameters need to be used in an arithmetic encoding process: a probability estimation value of each symbol and a current interval value. There are only two values 0 and 1 for input symbols. A least probable symbol (LPS) indicates one of 0 and 1 whose probability estimation value is less, and whose occurrence probability is in a value range of (0, 0.5]; contrary to a definition of the LPS, a most probable symbol (MPS) indicates one of 0 and 1 whose probability estimation value is greater, and whose occurrence probability is in a value range of [0, 1). The current encoding interval is denoted by using an interval magnitude R and a lower limit value low of the current encoding interval, $p_{LPS}$ denotes a probability of the LPS, $p_{MPS}$ denotes a probability of the MPS, and $p_{LPS}+p_{MPS}=1$. The value R and the value low of the interval are updated as follows:

If the current input symbol is an MPS, $R_{MPS}=R \times p_{MPS}$; and $Low_{n+1}=low_n$; or if the current input symbol is an LPS, $R_{LPS}=R-R \times p_{MPS}$; and $low_{n+1}=low_n+R_n \times p_{MPS}$.

The decoding end may perform decoding to obtain a binary symbol string by maintaining the value R and the value low. A value R and a value low of an interval in a specific implementation process both have a finite precision, and therefore in an arithmetic encoding/decoding process, a normalization process needs to be used to enable an encoding interval to be limited to being within a range. A basic principle of normalization is that after R reaches a precision lower limit, the value R and the value low are doubled, and then whether the value R satisfies a precision requirement is determined. If the value R does not satisfy the precision requirement, a normalization operation continues to be performed until it is ensured that the value R satisfies the precision requirement.

When arithmetic encoding is performed, two modes generally exist: 1. General mode: in the mode, probabilities that binary symbols in a binary symbol string encoded by an arithmetic encoding engine are input are generally different from each other, and therefore the arithmetic encoding engine needs to input two parameters during encoding: a value of a to-be-encoded symbol and a probability of the symbol. To-be-encoded symbols are sequentially input in a binarized binary symbol string, and probabilities of the symbols are obtained after a probability model performs selection. 2. Bypass mode: in the mode, probabilities that binary symbols in a binary symbol string encoded by an arithmetic encoding engine are input are all the same, and generally the probabilities are set to 0.5, and therefore the arithmetic encoding engine can complete encoding as long as values of to-be-encoded symbols are input during encoding. The general mode and the bypass mode may be mixed to perform encoding/decoding, that is, a former binary symbol is encoded/decoded in the general mode, and a latter binary symbol is encoded/decoded in the bypass mode. Generally, encoding/decoding complexity of the bypass mode is lower than that of the general mode.

3. An arithmetic encoding interval is updated according to a value of a code stream symbol and a probability value corresponding to the code stream symbol to decode the binary code stream symbol. Two basic parameters need to be used in an arithmetic decoding process: a probability estimation value of each symbol and a current interval value. There are only two values 0 and 1 for input symbols. A least probable symbol indicates one of 0 and 1 whose probability estimation value is less, and whose occurrence probability is in a value range of (0, 0.5]; contrary to a definition of the LPS, a most probable symbol indicates one of 0 and 1 whose probability estimation value is greater, and whose occurrence probability is in a value range of [0, 1). The current encoding interval is denoted by using an interval magnitude R of the current encoding interval, an offset of a lower limit value of the arithmetic encoding interval is denoted by using offset, $p_{LPS}$ denotes a probability of the LPS, $p_{MPS}$ denotes a probability of the MPS, and $p_{LPS}+p_{MPS}=1$. The value R and the value offset of the interval are updated as follows:

If the current decoding symbol is an MPS, $R_{MPS}=R \times p_{MPS}$; and $offset_{n+1}=low_n$; or if the current decoding symbol is an LPS, $R_{LPS}=R-R \times p_{MPS}$; and $offset_{n+1}=offset_n-R_n \times p_{MPS}$.

The decoding end may perform decoding to obtain a binary symbol string by maintaining the value R and the value offset. A value R and a value offset of an interval in a specific implementation process both have a finite precision, and therefore in an arithmetic encoding/decoding process, a normalization process needs to be used to enable an encoding interval to be limited to being within a range. A basic principle of normalization is that after R reaches a precision lower limit, the value R and the value offset are doubled, and then whether the value R satisfies a precision requirement is determined. If the value R does not satisfy the precision requirement, a normalization operation continues to be performed until it is ensured that the value R satisfies the precision requirement.

4. Meanings of the low in the arithmetic encoding and the offset in the arithmetic decoding are not the same. The low in the arithmetic encoding denotes a lower limit of an encoding interval; the offset in the arithmetic decoding is an offset of a lower limit value in an arithmetic encoding interval. An initialized value of the low is generally 0, and an initialized value of the offset is read-in code stream information.

5. The first encoding interval and the second encoding interval that are before update in the arithmetic encoding are both arithmetic encoding intervals. In the prior art, an arithmetic encoding process mainly needs to resolve a multiplication calculation problem in an encoding interval update process, and particularly, a problem that when an arithmetic encoding symbol rate is relatively high, multiplication becomes a hardware design bottleneck because the multiplication has a relatively long calculation delay. In the prior art, a multiplication replacement operation is implemented by means of table lookup, but a table lookup operation still has complexity to some extent, and the encoding/decoding end needs to store a lookup table. Consequently, storage overheads are caused.

SUMMARY

Embodiments of the present application provide video data encoding and decoding methods and apparatuses, so as to conveniently perform data encoding and decoding on video data.

A first aspect of the embodiments of the present application provides a video data encoding method, including: arithmetic encoding, where the arithmetic encoding includes:

obtaining a binary symbol of image data; and if the binary symbol is a most probable symbol (MPS), updating a first encoding interval corresponding to the MPS in a logarithm domain; and if the updated first encoding interval is less than a preset range of an arithmetic encoding interval, performing normalization processing on the first encoding interval in the logarithm domain; or if the binary symbol is a least probable symbol (LPS) updating a second encoding interval corresponding to the LPS in an original number domain, and performing normalization processing on the second encoding interval in the original number domain.

With reference to the first aspect, in a first possible implementation manner, before the updating a first encoding interval corresponding to the MPS in a logarithm domain, the method includes:

if a current encoding interval is an original number domain, converting the encoding interval from the original number domain to a logarithm domain according to a method for approximate conversion between a logarithm and an original number.

With reference to the first aspect, in a second possible implementation manner, before the updating a second encoding interval corresponding to the LPS in an original number domain, the method includes:

if a current encoding interval is a logarithm domain, converting the encoding interval from the logarithm domain to an original number domain according to a method for approximate conversion between a logarithm and an original number.

With reference to the second possible implementation manner of the first aspect, in a third possible implementation manner, the updating a second encoding interval corresponding to the LPS in an original number domain includes:

determining an interval value of the updated second encoding interval according to a probability of the first encoding interval, interval information of the arithmetic encoding interval, and interval information of the first encoding interval.

With reference to the second possible implementation manner of the first aspect, in a fourth possible implementation manner, the updating a second encoding interval corresponding to the LPS in an original number domain further includes:

determining a lower limit value of the updated second encoding interval according to an interval value of the first encoding interval.

With reference to the second possible implementation manner of the first aspect, in a fifth possible implementation manner, the converting the encoding interval from the logarithm domain to an original number domain according to a method for approximate conversion between a logarithm and an original number includes:

$$\begin{cases} R1 = 2^{-s1+t1} \approx (1+t1) \gg s1 \\ R2 = 2^{-s2+t2} \approx (1+t2) \gg s2 \end{cases}, \quad \text{formula 1}$$

$$R_{LPS1} = 2^{-s2} \times \begin{cases} t1-t2, s1=s2 \\ 1+(t1 \ll 1)-t2, s1=s2-1 \end{cases}, \quad \text{formula 2}$$

where

R1 and R2 are an interval value of the arithmetic encoding interval and an interval value of the first encoding interval in the original number domain respectively, s1 and t1 are interval information of the arithmetic encoding interval, s2 and t2 are interval information of the first encoding interval, s1 is an integer not less than the arithmetic encoding interval in the logarithm domain, s2 is an integer not less than the first encoding interval in the logarithm domain, and t1 and t2 are both real numbers less than 1 and greater than or equal to 0; and $R_{LPS1}$ is an interval value of the second encoding interval before update in the original number domain;

according to the formula 1, separately determining the interval value of the arithmetic encoding interval and the interval value of the first encoding interval in the original number domain according to the method for approximate conversion between a logarithm and an original number, the interval information of the arithmetic encoding interval, and the interval information of the first encoding interval; and according to the formula 2, determining an interval value of the updated second encoding interval according to the interval value of the arithmetic encoding interval and the interval value of the first encoding interval in the original number domain.

With reference to the fifth possible implementation manner of the first aspect, in a sixth possible implementation manner, the determining an interval value of the updated second encoding interval according to a probability of the MPS, interval information of the arithmetic encoding interval, and interval information of the first encoding interval includes:

$$LG\_P_{MPS} = LG\_R1 - LG\_R2 = s1 - t1 - s2 + t2; \text{ and} \quad \text{formula 3}$$

$$R_{LPS2} = 2^{-s2} \times \begin{cases} LG_{PMPS}, s1=s2 \\ 1+t1+LG_{PMPS}, s1=s2-1 \end{cases}, \quad \text{formula 4}$$

where $LG\_P_{MPS}$ is a probability of the first encoding interval in the logarithm domain, and $LG\_R1$ and $LG\_R2$ are an interval value of the arithmetic encoding interval and an interval value of the first encoding interval in the logarithm domain respectively; and $R_{LPS}$ is an interval value of the updated second encoding interval in the original number domain;

according to the formula 3, determining an arithmetic expression of $LG\_P_{MPS}$ according to the interval information of the arithmetic encoding interval and the interval information of the first encoding interval; and according to the formula 4, performing conversion with reference to the formula 2 and the formula 3, to obtain an interval value of the updated second encoding interval.

With reference to the fourth possible implementation manner of the first aspect, in a seventh possible implementation manner, the determining a lower limit value of the updated second encoding interval according to an interval value of the first encoding interval includes:

$$low2 = low1 + R2 = low + 2^{-s2+t2} \approx low1 + (1+t2) \gg s2 \quad \text{formula 5}$$

where low2 is a lower limit value of the updated second encoding interval in the original number domain, low1 is a lower limit value of the second encoding interval before update in the original number domain, and R2 is an interval value of the first encoding interval in the original number domain; and according to the formula 5, obtaining an interval value of the updated second encoding interval according to the method for approximate conversion between a logarithm and an original number.

With reference to the first aspect, in an eighth possible implementation manner, the performing normalization processing on the first encoding interval in the logarithm domain includes:

$$LG\_R2_{(2)} = LG\_R2_{(1)} + 1, \text{ where} \quad \text{formula 6}$$

$LG\_R2_{(2)}$ is an interval value of the normalized first encoding interval in the logarithm domain, and $LG\_R2_{(1)}$ is an interval value of the first encoding interval in the logarithm domain before normalization; and according to the formula 6, performing calculation to obtain the interval value of the normalized first encoding interval in the logarithm domain.

With reference to the first aspect, in a ninth possible implementation manner, after the updating a first encoding interval corresponding to the MPS in a logarithm domain, the method includes:

$$LG_{\_R1} = s1 - t1 (0 \leq t1 < 1)$$  formula 7

$$LG_{\_R2} = s2 - t2 (0 \leq t2 < 1),$$

where s1 and t1 are interval information of the arithmetic encoding interval, s2 and t2 are interval information of the first encoding interval, s1 is an integer not less than the arithmetic encoding interval in the logarithm domain, s2 is an integer not less than the first encoding interval in the logarithm domain, and t1 and t2 are both real numbers less than 1 and greater than or equal to 0;

after update on the first encoding interval is completed, according to the formula 7, assigning values of s2 and t2 to s1 and t1.

With reference to the ninth possible implementation manner of the first aspect, in a tenth possible implementation manner, before the performing normalization processing on the first encoding interval in the logarithm domain, the method includes:

determining, according to updated s1, whether a normalization operation needs to be performed after encoding on the MPS is completed, and when s1 is greater than 0, performing a normalization operation on the first encoding interval.

With reference to the sixth possible implementation manner of the first aspect, in an eleventh possible implementation manner, the performing normalization processing on the second encoding interval in the original number domain includes:

performing a left offset operation of binary calculation on $2^{-s2}$ in the formula 4;

performing a left offset operation of binary calculation on (t1−t2) or (1+t1<<1)−t2 in the formula 4; and when $2^{-s2}$ is offset to left by s2 bits, and (t1−t2) or (1+t1<<1)−t2 is offset to left by q bits, normalizing the second encoding interval, where q is an arithmetic precision of the encoding interval.

With reference to the second possible implementation manner of the first aspect, in a twelfth possible implementation manner, the converting the encoding interval from the logarithm domain to an original number domain according to a method for approximate conversion between a logarithm and an original number further includes:

$$\begin{cases} R1 \approx (256 + t1) \gg s1 \\ R2 \approx (256 + t2) \gg s2 \end{cases};$$  formula 8 where

R1 and R2 are a value of the arithmetic encoding interval and a value of the first encoding interval in the original number domain respectively, s1 is interval information of the arithmetic encoding interval, s2 is interval information of the first encoding interval, s1 is an integer not less than the arithmetic encoding interval in the logarithm domain, and s2 is an integer not less than the first encoding interval in the logarithm domain; and when the arithmetic encoding interval is denoted by nine bits and t1 and t2 are denoted by an eight-bit precision, according to the formula 7, performing calculation to obtain a value of the second encoding interval before update.

With reference to the twelfth possible implementation manner of the first aspect, in a thirteenth possible implementation manner, the determining a value of the updated second encoding interval according to a probability of the first encoding interval, interval information of the arithmetic encoding interval, and interval information of the first encoding interval further includes:

when a precision of $LG\_P_{MPS}$ is equal to the precision of t1, if t1 is greater than or equal to $LG\_P_{MPS}$, s2=s1 and t2=t1−$LG\_P_{MPS}$; or if t1 is less than $LG\_P_{MPS}$, s2=s1+1 and t2=256+t1−$LG\_P_{MPS}$; and in a bypass mode, s2=s1+1 and t2=t1, where $LG\_P_{MPS}$ is a probability of the first encoding interval in the logarithm domain, t1 is the interval information of the arithmetic encoding interval, t2 is the interval information of the first encoding interval, and t1 and t2 are both real numbers less than 1 and greater than or equal to 0.

With reference to the twelfth possible implementation manner of the first aspect, in a fourteenth possible implementation manner, the determining a value of the updated second encoding interval according to a probability of the first encoding interval, interval information of the arithmetic encoding interval, and interval information of the first encoding interval further includes:

when a precision of $LG\_P_{MPS}$ is greater than the precision of t1, if t1 is greater than or equal to $LG\_P_{MPS}$>>$LG\_P_{MPS}\_SHIFTNO$, s2=s1 and t2=t1−$LG\_P_{MPS}$; or if t1 is less than $LG\_P_{MPS}$>>$LG\_P_{MPS}\_SHIFTNO$, s2=s1+1 and t2=256+t1−($LG\_P_{MPS}$>>$LG\_P_{MPS}\_SHIFTNO$); and in a bypass mode, s2=s1+1 and t2=t1, where $LG\_P_{MPS}$ is a probability of the first encoding interval in the logarithm domain, t1 is the interval information of the arithmetic encoding interval, t2 is the interval information of the first encoding interval, t1 and t2 are both real numbers less than 1 and greater than or equal to 0, and $LG\_P_{MPS}\_SHIFTNO$ is a difference between $LG\_P_{MPS}$ and a quantity of bits of t1 and t2.

With reference to the sixth possible implementation manner of the first aspect, in a fifteenth possible implementation manner, the performing normalization processing on the second encoding interval in the original number domain includes:

when the arithmetic encoding interval is denoted by nine bits, t1 and t2 are denoted by an eight-bit precision, and a precision of $LG\_P_{MPS}$ is greater than a precision of t1, normalizing the second encoding interval to satisfy the formula 8;

$$R_{LPS2} = \begin{cases} LG_{PMPS} \gg LG_{PMPS_{SHIFTNO}}, s1 = s2 \\ 1 + t1 + (LG_{PMPS} \gg LG_{PMPS_{SHIFTNO}}), s1 = s2 - 1 \end{cases};$$  formula 9 and performing a left offset operation of binary calculation on $2^{-s2}$ in the formula 4;

performing a left offset operation of binary calculation on (t1−t2) or (1+t1<<1)−t2 in the formula 4; and when $2^{-s2}$ is offset to left by s2 bits, and (t1−t2) or (1+t1<<1)−t2 is offset to left by q bits, normalizing the second encoding interval, where q is an arithmetic precision of the encoding interval, and LG_$P_{MPS}$_SHIFTNO is a difference between LG_$P_{MPS}$ and a quantity of bits of t1 and t2.

A second aspect of the embodiments of the present application provides a video data decoding method, including: arithmetic encoding, where the arithmetic encoding includes:

obtaining a binary code stream of image data, and initializing an arithmetic encoding interval and a code stream pointer of the binary code stream, where the code stream pointer is an offset of a lower limit value of the arithmetic encoding interval;

determining, in a logarithm domain according to a probability of a most probable symbol (MPS) and the arithmetic encoding interval, an interval value of a first encoding interval corresponding to the MPS; and when the code stream pointer is greater than or equal to the value of the first encoding interval, determining that a binary symbol currently obtained by means of decoding is a least probable symbol (LPS), updating an interval value of the arithmetic encoding interval to an interval value of a second encoding interval corresponding to the LPS, and updating a value of the code stream pointer to a difference between the original code stream pointer and an upper limit value of the first encoding interval; or when the code stream pointer is less than the value of the first encoding interval, determining that a binary symbol currently obtained by means of decoding is an MPS, and updating an interval value of the arithmetic encoding interval to the interval value of the first encoding interval, where the code stream pointer does not change.

With reference to the second aspect, in a first possible implementation manner, if a current encoding interval is in the logarithm domain, before the determining that a binary symbol currently obtained by means of decoding is a least probable symbol (LPS), or before the determining that a binary symbol currently obtained by means of decoding is an MPS, the method includes:

converting the encoding interval from the logarithm domain to an original number domain, where a value of the code stream pointer and a value of the updated code stream pointer are values of the original number domain.

With reference to the first possible implementation manner of the second aspect, in a second possible implementation manner, the converting the encoding interval from the logarithm domain to an original number domain includes:

$R2 \approx (1+t2) >> s2$; and    formula 10

R2 is an interval value of an encoding interval corresponding to an MPS, s2 and t2 are interval information of the first encoding interval, s2 is an integer not less than the first encoding interval in the logarithm domain, and t2 is a real number less than 1 and greater than or equal to 0; and according to the formula 10, performing calculation to obtain the interval value of the first encoding interval.

With reference to the second possible implementation manner of the second aspect, in a third possible implementation manner, the updating a value of the code stream pointer to a difference between the original code stream pointer and an upper limit value of the first encoding interval includes:

offset$_{new}$=offset−R2, where    formula 11 offset_new is a value of the updated code stream pointer, offset is a value of the code stream pointer, and R2 is an interval value of an encoding interval corresponding to an MPS;

specifically, to satisfy a precision requirement of the formula 11, during specific calculation, expanding the value R2 by s2 times, and correspondingly expanding the value offset by s2 times; and according to the formula 11, performing calculation to obtain a value of the updated code stream pointer.

With reference to the second aspect, in a first possible implementation manner, if a current encoding interval is in the logarithm domain, before the determining that a binary symbol currently obtained by means of decoding is a least probable symbol (LPS) or before the determining that a binary symbol currently obtained by means of decoding is an MPS, the method includes:

comparing the value of the first encoding interval and the value of the code stream pointer, where the value of the code stream pointer and the value of the updated code stream pointer are values of the logarithm domain.

With reference to the second possible implementation manner of the second aspect, in a third possible implementation manner, the updating a value of the code stream pointer to a difference between the original code stream pointer and an upper limit value of the first encoding interval includes:

$$\text{offset} \approx 2^{-s2} \times \begin{cases} \text{value}_t - t2, s2 = \text{value\_s} \\ 1 + (\text{vlaue}_t \ll 1 | \text{readbit}(1) -, \\ t2, s2 = \text{value}_s + 1 \end{cases} \quad \text{formula 19}$$

where offset is the code stream pointer, value_s and value$_t$ are interval information of the code stream pointer, value_s is an integer not less than the code stream pointer in the logarithm domain, and value$_t$ is a real number less than 1 and greater than or equal to 0; and according to the formula 19, performing calculation to obtain a value of the updated code stream pointer.

Specifically, when the difference between the code stream pointer and the upper limit value of the first encoding interval is determined, the method includes:

if offset is an original number domain, updating the value of the code stream pointer according to the method of the formula 11; and if offset is a logarithm domain, updating the value of the code stream pointer according to the method of the formula 19, so as to simplify a decoding process.

With reference to the second aspect, in a fourth possible implementation manner, the determining, in a logarithm domain according to a probability of a most probable symbol (MPS) and the arithmetic encoding interval, an interval value of a first encoding interval corresponding to the MPS includes:

LG_R2=LG_R1+LG_$P_{MPS}$, where    formula 12

LG_$P_{MPS}$ is a probability of the first encoding interval in the logarithm domain, and LG_R1 and LG_R2 are an interval value of the arithmetic encoding interval and an interval value of the first encoding interval in the logarithm domain respectively; and according to the formula 12, performing calculation to obtain the interval value of the first encoding interval corresponding to the MPS.

With reference to any one of the second aspect or the first to the fourth possible implementation manners of the second aspect, in a fifth possible implementation manner, before the updating an interval value of the arithmetic encoding interval to the interval value of the first encoding interval, the method includes:

converting the encoding interval from the original number domain to the logarithm domain.

According to a third aspect of the embodiments of the present application, a data encoding apparatus includes:

a symbol obtaining unit, configured to obtain a binary symbol of image data;

a first update unit, configured to: if the binary symbol is a most probable symbol (MPS), update a first encoding interval corresponding to the MPS in a logarithm domain;

a first normalization unit, configured to: if the updated first encoding interval is less than a preset range of an arithmetic encoding interval, perform normalization processing on the first encoding interval in the logarithm domain;

a second update unit, configured to: if the binary symbol is a least probable symbol (LPS) update a second encoding interval corresponding to the LPS in an original number domain; and a second normalization unit, configured to perform normalization processing on the second encoding interval in the original number domain.

With reference to the third aspect, in a first possible implementation manner, the apparatus further includes:

an arithmetic conversion unit, configured to: if a current encoding interval is an original number domain, convert the encoding interval from the original number domain to a logarithm domain according to a method for approximate conversion between a logarithm and an original number.

With reference to the third aspect, in a second possible implementation manner, the apparatus further includes:

an arithmetic conversion unit, configured to: if a current encoding interval is a logarithm domain, convert the encoding interval from the logarithm domain to an original number domain according to a method for approximate conversion between a logarithm and an original number.

With reference to the second possible implementation manner of the third aspect, in a third possible implementation manner, the second update unit is specifically configured to:

determine an interval value of the updated second encoding interval according to a probability of the first encoding interval, interval information of the arithmetic encoding interval, and interval information of the first encoding interval.

With reference to the second possible implementation manner of the third aspect, in a fourth possible implementation manner, the second update unit is specifically further configured to:

determine a lower limit value of the updated second encoding interval according to an interval value of the first encoding interval.

With reference to the second possible implementation manner of the third aspect, in a fifth possible implementation manner, the arithmetic conversion unit is specifically configured to:

$$\begin{cases} R1 = 2^{-s1+t1} \approx (1+t1) \gg s1 \\ R2 = 2^{-s2+t2} \approx (1+t2) \gg s2 \end{cases}; \text{ and} \qquad \text{formula 1}$$

$$R_{LPS1} = 2^{-s2} \times \begin{cases} t1 - t2, s1 = s2 \\ 1 + (t1 \ll 1) - t2, s1 = s2 - 1 \end{cases}, \qquad \text{formula 2}$$

where

R1 and R2 are an interval value of the arithmetic encoding interval and an interval value of the first encoding interval in the original number domain respectively, s1 and t1 are interval information of the arithmetic encoding interval, s2 and t2 are interval information of the first encoding interval, s1 is an integer not less than the arithmetic encoding interval in the logarithm domain, s2 is an integer not less than the first encoding interval in the logarithm domain, and t1 and t2 are both real numbers less than 1 and greater than or equal to 0; and $R_{LPS1}$ is an interval value of the second encoding interval before update in the original number domain;

according to the formula 1, separately determine the interval value of the arithmetic encoding interval and the interval value of the first encoding interval in the original number domain according to the method for approximate conversion between a logarithm and an original number, the interval information of the arithmetic encoding interval, and the interval information of the first encoding interval; and according to the formula 2, determine an interval value of the updated second encoding interval according to the interval value of the arithmetic encoding interval and the interval value of the first encoding interval in the original number domain.

With reference to the fifth possible implementation manner of the third aspect, in a sixth possible implementation manner, the arithmetic conversion unit is specifically further configured to:

$$LG\_P_{MPS} = LG\_R1 - LG\_R2 = s1 - t1 - s2 + t2; \text{ and} \qquad \text{formula 3}$$

$$R_{LPS2} = 2^{-s2} \times \begin{cases} LG_{PMPS}, s1 = s2 \\ 1 + t1 + LG_{PMPS}, s1 = s2 - 1 \end{cases}, \qquad \text{formula 4}$$

where $LG\_P_{MPS}$ is a probability of the first encoding interval in the logarithm domain, and LG_R1 and LG_R2 are an interval value of the arithmetic encoding interval and an interval value of the first encoding interval in the logarithm domain respectively; and $R_{LPS}$ is an interval value of the updated second encoding interval in the original number domain;

according to the formula 3, determine an arithmetic expression of $LG\_P_{MPS}$ according to the interval information of the arithmetic encoding interval and the interval information of the first encoding interval; and according to the formula 4, perform conversion with reference to the formula 2 and the formula 3, to obtain an interval value of the updated second encoding interval.

With reference to the fourth possible implementation manner of the third aspect, in a seventh possible implementation manner, the second update unit is specifically further configured to:

$$low2=low1+R2=low1+2^{-s2+t2}\approx low1+(1+t2)\gg s2 \qquad \text{formula 5}$$

where low2 is a lower limit value of the updated second encoding interval in the original number domain, low1 is a lower limit value of the second encoding interval before update in the original number domain, and R2 is an interval value of the first encoding interval in the original number domain; and according to the formula 5, obtain an interval value of the updated second encoding interval according to the method for approximate conversion between a logarithm and an original number.

With reference to the third aspect, in an eighth possible implementation manner, the first normalization unit is specifically configured to:

$$LG\_R2_{(2)}=LG\_R2_{(1)}+1, \text{ where} \qquad \text{formula 6}$$

$LG\_R2_{(2)}$ is an interval value of the normalized first encoding interval in the logarithm domain, and $LG\_R2_{(1)}$ is an interval value of the first encoding interval in the logarithm domain before normalization; and according to the formula 6, perform calculation to obtain the interval value of the normalized first encoding interval in the logarithm domain.

With reference to the third aspect, in a ninth possible implementation manner, the first update unit is further configured to:

$$LG_{\_R1} = s1 - t1 (0 \leq t1 < 1) \qquad \text{formula 7}$$
$$LG_{\_R2} = s2 - t2 (0 \leq t2 < 1),$$

where s1 and t1 are interval information of the arithmetic encoding interval, s2 and t2 are interval information of the first encoding interval, s1 is an integer not less than the arithmetic encoding interval in the logarithm domain, s2 is an integer not less than the first encoding interval in the logarithm domain, and t1 and t2 are both real numbers less than 1 and greater than or equal to 0;

after update on the first encoding interval is completed, according to the formula 7, assign values of s2 and t2 to s1 and t1.

With reference to the ninth possible implementation manner of the third aspect, in a tenth possible implementation manner, the first normalization unit is specifically configured to: before the performing normalization processing on the first encoding interval in the logarithm domain, determine, according to updated s1, whether a normalization operation needs to be performed after encoding on the MPS is completed, and when s1 is greater than 0, perform a normalization operation on the first encoding interval.

With reference to the sixth possible implementation manner of the third aspect, in an eleventh possible implementation manner, the second normalization unit is specifically configured to:

perform a left offset operation of binary calculation on $2^{-s2}$ in the formula 4;

perform a left offset operation of binary calculation on (t1−t2) or (1+t1<<1)−t2 in the formula 4; and when $2^{-s2}$ is offset to left by s2 bits, and (t1−t2) or (1+t1<<1)−t2 is offset to left by q bits, normalize the second encoding interval, where q is an arithmetic precision of the encoding interval.

With reference to the second possible implementation manner of the third aspect, in a twelfth possible implementation manner, the arithmetic conversion unit is specifically further configured to:

$$R1 \approx (256 + t1) \gg s1 \qquad \text{formula 8}$$
$$R2 \approx (256 + t2) \gg s2,$$

where

R1 and R2 are a value of the arithmetic encoding interval and a value of the first encoding interval in the original number domain respectively, s1 is interval information of the arithmetic encoding interval, s2 is interval information of the first encoding interval, s1 is an integer not less than the arithmetic encoding interval in the logarithm domain, and s2 is an integer not less than the first encoding interval in the logarithm domain; and when the arithmetic encoding interval is denoted by nine bits and t1 and t2 are denoted by an eight-bit precision, according to the formula 7, perform calculation to obtain a value of the second encoding interval before update.

With reference to the twelfth possible implementation manner of the third aspect, in a thirteenth possible implementation manner, the second update unit is specifically further configured to:

when a precision of $LG\_P_{MPS}$ is equal to the precision of t1, if t1 is greater than or equal to $LG\_P_{MPS}$, s2=s1 and t2=t1−$LG\_P_{MPS}$; or if t1 is less than $LG\_P_{MPS}$, s2=s1+1 and t2=256+t1−$LG\_P_{MPS}$; and in a bypass mode, s2=s1+1 and t2=t1, where $LG\_P_{MPS}$ is a probability of the first encoding interval in the logarithm domain, t1 is the interval information of the arithmetic encoding interval, t2 is the interval information of the first encoding interval, and t1 and t2 are both real numbers less than 1 and greater than or equal to 0.

With reference to the twelfth possible implementation manner of the third aspect, in a fourteenth possible implementation manner, the second update unit is specifically further configured to:

when a precision of $LG\_P_{MPS}$ is greater than the precision of t1, if t1 is greater than or equal to $LG\_P_{MPS}\gg LG\_P_{MPS}\_SHIFTNO$, s2=s1 and t2=t1−$LG\_P_{MPS}$; or if t1 is less than $LG\_P_{MPS}\gg LG\_P_{MPS}\_SHIFTNO$, s2=s1+1 and t2=256+t1−($LG\_P_{MPS}\gg LG\_P_{MPS}\_SHIFTNO$); and in a bypass mode, s2=s1+1 and t2=t1, where $LG\_P_{MPS}$ is a probability of the first encoding interval in the logarithm domain, t1 is the interval information of the arithmetic encoding interval, t2 is the interval information of the first encoding interval, t1 and t2 are both real numbers less than 1 and greater than or equal to 0, and $LG\_P_{MPS}\_SHIFTNO$ is a difference between $LG\_P_{MPS}$ and a quantity of bits of t1 and t2.

With reference to the sixth possible implementation manner of the third aspect, in a fifteenth possible implementation manner, the second normalization unit is specifically further configured to:

when the arithmetic encoding interval is denoted by nine bits, t1 and t2 are denoted by an eight-bit precision, and a precision of $LG\_P_{MPS}$ is greater than a precision of t1, normalizing the second encoding interval to satisfy the formula 8;

$$R_{LPS2} = \begin{cases} LG_{PMPS} \gg LG_{PMPS\,SHIFTNO}, & \\ \quad s1 = s2 & \\ 1 + t1 + (LG_{PMPS} \gg LG_{PMPS\,SHIFTNO}), & \\ \quad s1 = s2 - 1 & \end{cases} ; \qquad \text{formula 9}$$

and perform a left offset operation of binary calculation on $2^{-s2}$ in the formula 4;

perform a left offset operation of binary calculation on (t1−t2) or (1+t1<<1)−t2 in the formula 4; and when $2^{-s2}$ is offset to left by s2 bits, and (t1−t2) or (1+t1<<1)−t2 is offset to left by q bits, normalize the second encoding interval, where q is an arithmetic precision of the encoding interval, and $LG\_P_{MPS}\_SHIFTNO$ is a difference between $LG\_P_{MPS}$ and a quantity of bits of t1 and t2.

A fourth aspect of the embodiments of the present application provides a data decoding apparatus, including:

a code stream obtaining unit, configured to obtain a binary code stream of image data, and initialize an arithmetic encoding interval and a code stream pointer of the binary code stream, where the code stream pointer is an offset of a lower limit value of the arithmetic encoding interval;

an interval determining unit, configured to determine, in a logarithm domain according to a probability of a most probable symbol (LPS) and the arithmetic encoding interval, an interval value of a first encoding interval corresponding to the MPS;

a first interval update unit, configured to: when the code stream pointer is greater than or equal to the value of the first encoding interval, determine that a binary symbol currently obtained by means of decoding is a least probable symbol (LPS), update an interval value of the arithmetic encoding interval to an interval value of a second encoding interval corresponding to the LPS, and update a value of the code stream pointer to a difference between the original code stream pointer and an upper limit value of the first encoding interval; and a second interval update unit, configured to: when the code stream pointer is less than the value of the first encoding interval, determine that a binary symbol currently obtained by means of decoding is an MPS, and update an interval value of the arithmetic encoding interval to the interval value of the first encoding interval, where the code stream pointer does not change.

With reference to the fourth aspect, in a first possible implementation manner, the apparatus further includes:

a conversion unit, configured to: if a current encoding interval is in the logarithm domain, before it is determined that a binary symbol currently obtained by means of decoding is a least probable symbol (LPS), or before it is determined that a binary symbol currently obtained by means of decoding is an MPS, convert the encoding interval from the logarithm domain to an original number domain, where a value of the code stream pointer and a value of the updated code stream pointer are values of the original number domain.

With reference to the first possible implementation manner of the fourth aspect, in a second possible implementation manner, the conversion unit is specifically configured to:

$$R2=(1+t2)>>s2 \quad \text{formula 10}$$

R2 is an interval value of an encoding interval corresponding to an MPS, s2 and t2 are interval information of the first encoding interval, s2 is an integer not less than the first encoding interval in the logarithm domain, and t2 is a real number less than 1 and greater than or equal to 0; and according to the formula 10, perform calculation to obtain the interval value of the first encoding interval.

With reference to the second possible implementation manner of the fourth aspect, in a third possible implementation manner, the first interval update unit is specifically configured to:

$$\text{offset}_{new}=\text{offset}-R2, \text{ where} \quad \text{formula 11}$$

offset_new is a value of the updated code stream pointer, offset is a value of the code stream pointer, and R2 is an interval value of an encoding interval corresponding to an MPS;

specifically, to satisfy a precision requirement of the formula 11, during specific calculation, expand the value R2 by s2 times, and correspondingly expand the value offset by s2 times; and according to the formula 11, perform calculation to obtain a value of the updated code stream pointer.

With reference to the fourth aspect, in a first possible implementation manner, the apparatus further includes:

a determining unit, configured to compare the value of the code stream pointer and the value of the first encoding interval, where the value of the code stream pointer and the value of the updated code stream pointer are values of the logarithm domain.

With reference to the second possible implementation manner of the fourth aspect, in a third possible implementation manner, the first interval update unit is specifically configured to:

$$\text{offset} \approx 2^{-s2} \times \begin{cases} \text{value}_t - t2, s2 = \text{value}\_s & \text{formula 19} \\ 1 + (\text{vlaue}_t \ll 1)|\text{readbit}(1) -, \\ t2, s2 = \text{value}_s + 1 \end{cases}$$

where offset is the code stream pointer, value_s and $\text{value}_t$ are interval information of the code stream pointer, value_s is an integer not less than the code stream pointer in the logarithm domain, and $\text{value}_t$ is a real number less than 1 and greater than or equal to 0; and according to the formula 19, perform calculation to obtain a value of the updated code stream pointer.

Specifically, when the difference between the code stream pointer and the upper limit value of the first encoding interval is determined, the following is included:

if offset is an original number domain, updating the value of the code stream pointer according to the method of the formula 11; and if offset is a logarithm domain, updating the value of the code stream pointer according to the method of the formula 19, so as to simplify a decoding process.

With reference to the fourth aspect, in a fourth possible implementation manner, the interval determining unit is specifically configured to:

$$LG\_R2=LG\_R1+LG\_P_{MPS}; \text{ and} \quad \text{formula 12}$$

$LG\_P_{MPS}$ is a probability of the first encoding interval in the logarithm domain, and LG_R1 and LG_R2 are an interval value of the arithmetic encoding interval and an interval value of the first encoding interval in the logarithm domain respectively; and according to the formula 12, perform calculation to obtain the interval value of the first encoding interval corresponding to the MPS.

With reference to any one of the fourth aspect or the first to the fourth possible implementation manners of the fourth aspect, in a fifth possible implementation manner, the apparatus further includes:

a conversion unit, configured to: before the interval value of the arithmetic encoding interval is updated to the interval value of the first encoding interval, convert the encoding interval from the original number domain to the logarithm domain.

It can be seen from the foregoing technical solutions that, the embodiments of the present application have the following advantages:

In the embodiments of the present application, after a binary symbol of a signal source is received, whether the binary symbol is an MPS or an LPS is confirmed, and when it is confirmed that the binary symbol is an MPS, arithmetic encoding is performed in a logarithm domain. MPS interval update is performed by using a logarithm, so that a multiplication operation is replaced with an addition operation during calculation. When it is confirmed that the binary symbol is an LPS, arithmetic encoding is performed in an original number domain. Moreover, because a normalization operation is separately allowed to be used when the MPS and the LPS are encoded, and a maximum quantity of normalization times in one normalization process is clarified, codec implementation is facilitated.

BRIEF DESCRIPTION OF DRAWINGS

To describe the technical solutions in the embodiments of the present application more clearly, the following briefly describes the accompanying drawings for describing the embodiments. The accompanying drawings in the following description show merely some embodiments of the present application, and a person of ordinary skill in the art may still derive other drawings from these accompanying drawings without creative efforts.

DESCRIPTION OF EMBODIMENTS

The following clearly describes the technical solutions in the embodiments of the present application with reference to the accompanying drawings in the embodiments of the present application. The described embodiments are merely a part rather than all of the embodiments of the present application. All other embodiments obtained by a person of ordinary skill in the art based on the embodiments of the present application without creative efforts shall fall within the protection scope of the present application.

Figure 1:
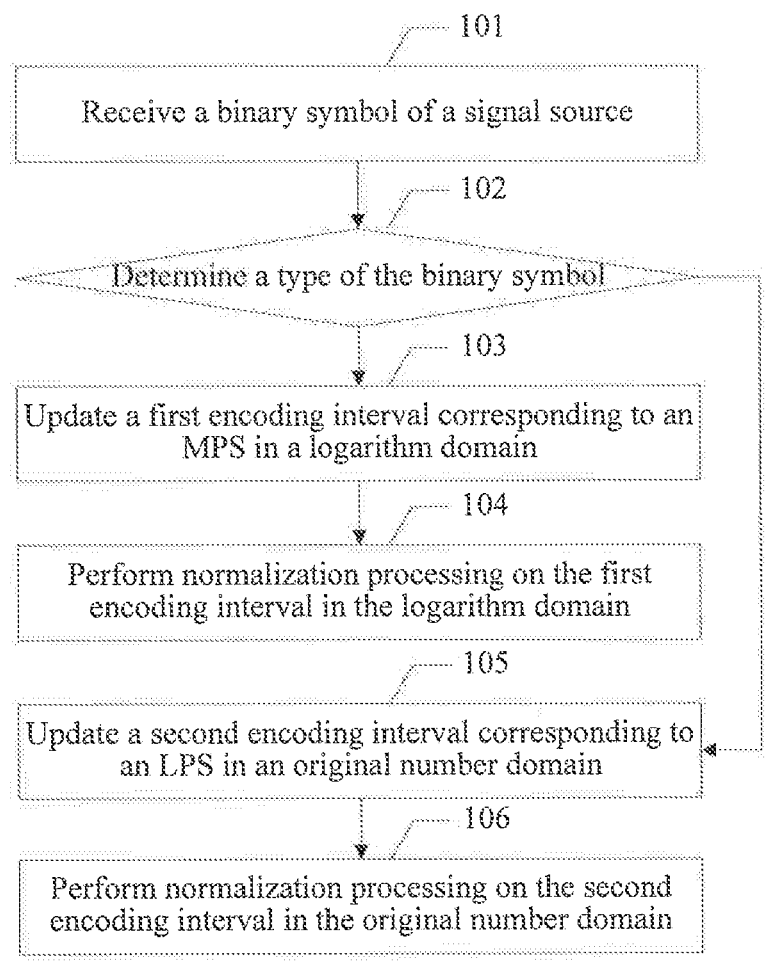
FIG. 1 is a schematic flowchart of a video data encoding method according to an embodiment of the present application.

Referring to FIG. 1, an embodiment of a video data encoding method in an embodiment of the present application includes:

101: Receive a binary symbol of a signal source.

A data encoding apparatus receives the binary symbol of the signal source.

Specifically, the binary symbol may be signal data obtained after binarization processing is performed on a to-be-encoded element such as an image unit mode, an intra-frame prediction mode, a residual coefficient, or a motion vector.

In this embodiment of the present application, the data encoding apparatus is a device that has a data encoding function in this embodiment of the present application, may specifically be a single physical device, including multiple physical modules, or may be a software program loaded into a computer, or a function module in software, or exist in a form of independent software or in a form of plug-in.

102: Determine a type of the binary symbol.

The data encoding apparatus determines the type of the binary symbol, and if the binary symbol is an MPS, step 103 is performed; or if the binary symbol is an LPS, step 105 is performed.

After the binary symbol is received, an arithmetic encoding interval needs to be updated according to a value of the binary symbol (that is, determine whether the value of the binary symbol is an MPS or an LPS) and a probability value corresponding to the binary symbol, so as to encode the binary symbol. Specifically, the LPS indicates one of 0 and 1 whose probability estimation value is relatively less, and whose occurrence probability is in a value range of (0, 0.5]; contrary to a definition of the LPS, the MPS indicates one of 0 and 1 whose probability estimation value is relatively greater, and whose occurrence probability is in a value range of [0.5, 1).

103: Update a first encoding interval corresponding to the MPS in a logarithm domain.

After it is determined that the binary symbol is an MPS, the data encoding apparatus updates the first encoding interval corresponding to the MPS in the logarithm domain.

Specifically, the first encoding interval denotes an encoding interval corresponding to the MPS, and the second encoding interval denotes an encoding interval corresponding to the LPS. In an actual application, the first encoding interval and the second encoding interval correspond to a same physical interval. In this embodiment of the present application, "first" and "second" are used to only distinguish types of symbols (that is, an MPS or an LPS), which are used for performing encoding, in the current encoding interval at different moments, and have no actual physical meaning.

Moreover, the arithmetic encoding interval is a variable maintained by the data encoding apparatus, and is a complete encoding interval initially, and a sum of the first encoding interval and the second encoding interval is equal to or approximately equal to the arithmetic encoding interval.

The current arithmetic encoding interval is denoted by using an interval value R1 and a lower limit value low of the current arithmetic encoding interval, $p_{LPS}$ denotes a probability of the LPS, $p_{MPS}$ denotes a probability of the MPS, and $p_{LPS}+p_{MPS}=1$. The value R1 and the value low of the interval are updated as follows:

$$R2 = R1 \times p_{MPS}; \text{ and}$$

$$\text{low}_{n+1} = \text{low}_n.$$

For example, the first encoding interval may be updated in the logarithm domain according to the following formula:

$$LG\_R2_{(2)} = LG\_R2_{(1)} + LG\_P_{MPS}, \text{ where}$$

$LG\_R2_{(2)}$ is an interval value of the updated first encoding interval in the logarithm domain, $LG\_R2_{(1)}$ is an interval value of the first encoding interval before update in the logarithm domain, and $LG\_P_{MPS}$ is a probability of the first encoding interval in the logarithm domain.

Specifically, the lower limit value of the encoding interval of the MPS does not change, and therefore, when update or a normalization operation is performed on the first encoding interval, the value low corresponding to the first encoding interval does not change.

104: Perform normalization processing on the first encoding interval in the logarithm domain.

After update on the first encoding interval is completed, it is determined whether normalization processing needs to be performed on the first encoding interval, and if the updated first encoding interval is less than a preset range of the arithmetic encoding interval, normalization processing is performed on the first encoding interval in the logarithm domain.

Specifically, the preset range may be set. For example, a default value of a preset range of an encoding/decoding system is one half.

Specifically, a principle of normalization is: after an encoding interval reaches a precision lower limit, the interval value and the value low of the encoding interval are doubled, and then whether the interval value of the encoding interval satisfies a precision requirement is determined. If the interval value of the encoding interval does not satisfy the precision requirement, a normalization operation continues to be performed until it is ensured that the interval value of the encoding interval satisfies the precision requirement.

In this embodiment of the present application, after the first encoding interval is updated, the first encoding interval may be less than the preset range of the arithmetic encoding interval. For example, if the preset range is one half, when the first encoding interval is less than one half of the arithmetic encoding interval, normalization processing needs to be performed on the first encoding interval.

Specifically, the probability of the MPS is greater than 0.5. Therefore, after normalization is performed once (that is, the original encoding interval is doubled), the precision requirement of the encoding interval may be satisfied.

For example, specific normalization calculation may be implemented according to a formula 6.

The formula 6 is:

$$LG\_R2_{(2)} = LG\_R2_{(1)} + 1, \text{ where}$$

$LG\_R2_{(2)}$ is an interval value of the normalized first encoding interval in the logarithm domain, and $LG\_R2_{(1)}$ is an interval value of the first encoding interval in the logarithm domain before normalization.

105: Update a second encoding interval corresponding to the LPS in an original number domain.

After it is determined that the binary symbol is an LPS, the data encoding apparatus updates the first encoding interval corresponding to the LPS in the original number domain.

The current arithmetic encoding interval is denoted by using an interval value R1 and a lower limit value low of the current arithmetic encoding interval, $p_{LPS}$ denotes a probability of the LPS, $p_{MPS}$ denotes a probability of the MPS, and $p_{LPS} + p_{MPS} = 1$. The value RLPS and the value low of the interval are updated as follows:

$$R_{LPS} = R1 - R1 \times p_{MPS}; \text{ and}$$

$$low_{n+1} = low_n + R_n \times p_{MPS}.$$

Specifically, if a current encoding interval is a logarithm domain, the encoding interval is converted from the logarithm domain to an original number domain according to a method for approximate conversion between a logarithm and an original number.

106: Perform normalization processing on the second encoding interval in the original number domain.

After update on the second encoding interval is completed, because the probability of the LPS is less than 0.5, normalization processing needs to be performed at least more than once after update.

Specifically, the lower limit value of the encoding interval of the LPS is the upper limit value of the first encoding interval. Therefore, when update or a normalization operation is performed on the second encoding interval, the value low needs to be updated according to the upper limit value of the first encoding interval.

Specifically, the interval value of the second encoding interval converted to the original number domain is denoted by using 2 to the power of X. Therefore, when a computer performs normalization calculation, shift calculation may be performed in a binary manner.

In this embodiment of the present application, for a mathematical relationship of $B = LOG(A)$, A is a value in an original number domain, and B is a value in a logarithm domain after the logarithm of A is taken. In the present application, a value of the original number domain and a value of the logarithm domain both follow this mathematical definition. The value of the binary symbol is 0 or 1 in arithmetic encoding/decoding. Therefore, LOG is a logarithm function using 2 as the base.

In this embodiment of the present application, after a binary symbol of a signal source is received, whether the binary symbol is an MPS or an LPS is confirmed, and when it is confirmed that the binary symbol is an MPS, arithmetic encoding is performed in a logarithm domain. MPS interval update is performed by using a logarithm, so that a multiplication operation is replaced with an addition operation during calculation. When it is confirmed that the binary symbol is an LPS, arithmetic encoding is performed in an original number domain.

Specifically, in an actual application of chip design, a hardware encoding/decoding operation is closely related to a clock frequency, an encoding/decoding operation that can be completed at each clock frequency need to be determined during design. In the prior art, normalization of conversion between the logarithm domain and the original number domain and the bypass mode are relatively complex in implementation, and a codec cannot determine a quantity of normalization times that is needed at most. The quantity of normalization times is indeterminate, and consequently, an operation that can be completed at a clock frequency during arithmetic encoding/decoding cannot be accurately known, thereby not facilitating hardware implementation. In this embodiment of the present application, a normalization operation is separately performed when the MPS and the LPS are encoded, so that a maximum quantity of times of encoding interval normalization may be separately determined on the MPS side and the LPS side, thereby facilitating codec implementation.

The foregoing approximate calculation mainly refers to that a multiplication operation is replaced by using addition, subtraction, or shift calculation, or logarithm table lookup is replaced by using addition, subtraction, or shift calculation (a logarithm function) to implement conversion between the original number domain and the logarithm domain, or inverse logarithm table lookup is replaced by using addition, subtraction, or shift calculation (or an inverse logarithm function) to implement conversion between the logarithm domain and the original number domain. The approximate calculation achieves a same objective as that of actual calculation (multiplication, a logarithm table, or an inverse logarithm table) within a precision range. The precision of the approximate calculation in the present application can satisfy the requirement of the present application.

Figure 2:
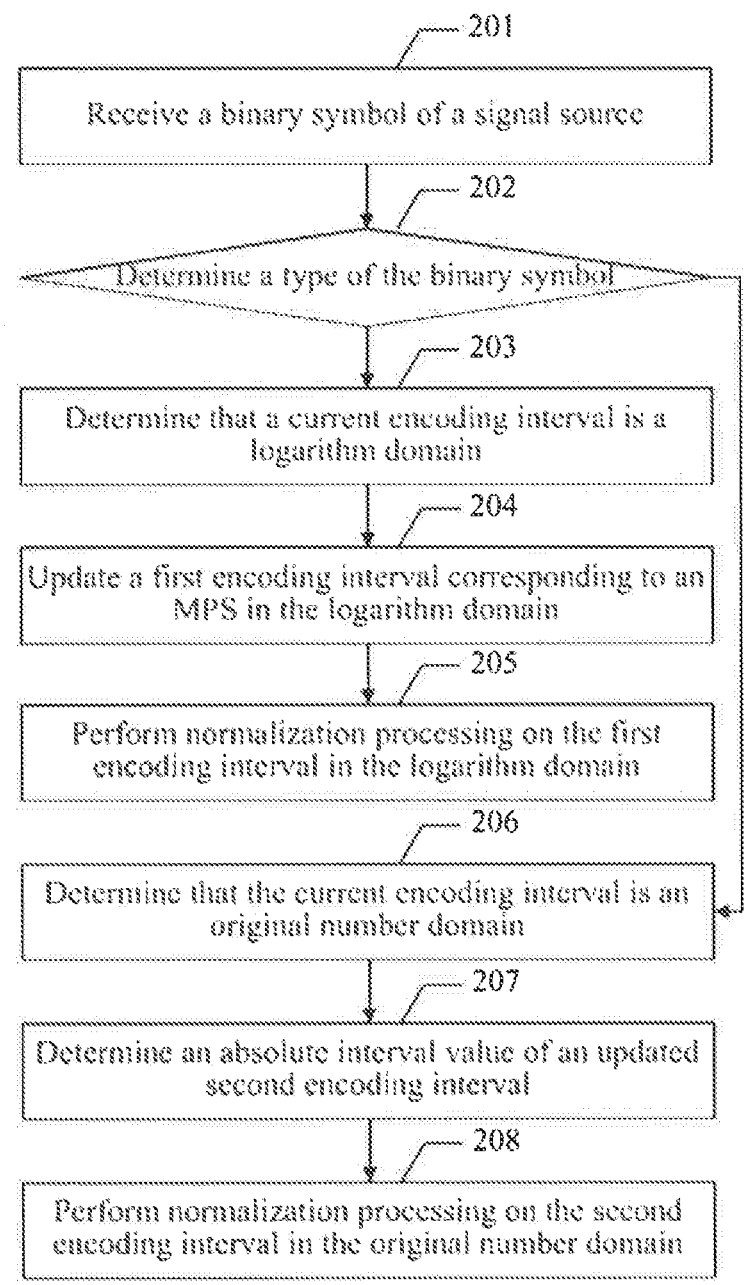
FIG. 2 is another schematic flowchart of a video data encoding method according to an embodiment of the present application.

A video data encoding method in an embodiment of the present application is described in detail below. Referring to FIG. 2, another embodiment of a video data encoding method in an embodiment of the present application includes:

201: Receive a binary symbol of a signal source.

A data encoding apparatus receives the binary symbol of the signal source.

Specifically, the binary symbol may be signal data obtained after binarization processing is performed on a to-be-encoded element such as an image unit mode, an intra-frame prediction mode, a residual coefficient, or a motion vector.

In this embodiment of the present application, the data encoding apparatus is a device that has a data encoding function in this embodiment of the present application, may specifically be a single physical device, including multiple physical modules, or may be a software program loaded into a computer, or a function module in software, or exist in a form of independent software or in a form of plug-in.

202: Determine a type of the binary symbol.

The data encoding apparatus determines the type of the binary symbol, and if the binary symbol is an MPS, step 203 is performed; or if the binary symbol is an LPS, step 206 is performed.

203: Determine that a current encoding interval is a logarithm domain.

The data encoding apparatus determines whether the current encoding interval is the logarithm domain, and if the current encoding interval is not the logarithm domain, converts the encoding interval from an original number domain to the logarithm domain according to a method for approximate conversion between a logarithm and an original number.

For example, it is assumed that a value range of x is [0, 1]. In this case, the following mathematical relationship may be obtained: LOG(1+x)≈x (0<=x<=1). Conversion between the original number domain and the logarithm domain may be implemented according to the foregoing mathematical relation. It should be noted that the foregoing approximate equation holds within a precision range. In the present application, the precision of the foregoing approximate equation can satisfy a requirement of the present application on a calculation precision.

Specifically, in an actual application, by using a conversion method for approximate calculation between a logarithm and an original number, a table lookup operation may be avoided, thereby further improving data encoding efficiency.

204: Update a first encoding interval corresponding to the MPS in a logarithm domain.

After it is determined that the binary symbol is an MPS, the data encoding apparatus updates the first encoding interval corresponding to the MPS in the logarithm domain.

Specifically, the first encoding interval denotes an encoding interval corresponding to the encoded MPS, and the second encoding interval denotes an encoding interval corresponding to the encoded LPS. Moreover, the arithmetic encoding interval is a variable maintained by the data encoding apparatus, and is a complete encoding interval initially, and a sum of the first encoding interval and the second encoding interval is equal to or approximately equal to the arithmetic encoding interval.

The current arithmetic encoding interval is denoted by using an interval value and a lower limit value low of the current arithmetic encoding interval, $p_{LPS}$ denotes a probability of the LPS, $p_{MPS}$ denotes a probability of the MPS, and $p_{LPS}+p_{MPS}=1$. The value R1 and the value low of the interval are updated as follows:

$$R2 = R1 \times p_{MPS}; \text{ and}$$

$$low_{n+1} = low_n.$$

For example, the first encoding interval may be updated in the logarithm domain according to the following formula:

$$LG\_R2_{(2)} = LG\_R2_{(1)} + LG\_P_{MPS}, \text{ where}$$

$LG\_R2_{(2)}$ is an interval value of the updated first encoding interval in the logarithm domain, $LG\_R2_{(1)}$ is an interval value of the first encoding interval before update in the logarithm domain, and $LG\_P_{MPS}$ is a probability of the first encoding interval in the logarithm domain.

Specifically, the lower limit value of the encoding interval of the MPS does not change. Therefore, when update or a normalization operation is performed on the first encoding interval, the value low corresponding to the first encoding interval does not change.

205: Perform normalization processing on the first encoding interval in the logarithm domain.

After update on the first encoding interval is completed, it is determined whether normalization processing needs to be performed on the first encoding interval, and if the updated first encoding interval is less than a preset range of the arithmetic encoding interval, normalization processing is performed on the first encoding interval in the logarithm domain.

Specifically, a principle of normalization is: after an encoding interval reaches a precision lower limit, the interval value and the value low of the encoding interval are doubled, and then whether the interval value of the encoding interval satisfies a precision requirement is determined. If the interval value of the encoding interval does not satisfy the precision requirement, a normalization operation continues to be performed until it is ensured that the interval value of the encoding interval satisfies the precision requirement.

In this embodiment of the present application, after the first encoding interval is updated at least twice, the first encoding interval may be less than one half of the arithmetic encoding interval. When the first encoding interval is less than one half of the arithmetic encoding interval, normalization processing needs to be performed on the first encoding interval.

Specifically, the probability of the MPS is greater than 0.5. Therefore, after normalization is performed once (that is, the original encoding interval is doubled), the precision requirement of the encoding interval may be satisfied.

For example, specific normalization calculation may be implemented according to formula 6.

The formula 6 is:

$$LG\_R2_{(2)} = LG\_R2_{(1)} + 1, \text{ where}$$

$LG\_R2_{(2)}$ is an interval value of the normalized first encoding interval in the logarithm domain, and $LG\_R2_{(1)}$ is an interval value of the first encoding interval in the logarithm domain before normalization.

206: Determine that the current encoding interval is an original number domain.

The data encoding apparatus determines whether the current encoding interval is the original number domain, and if the current encoding interval is not the original number domain, converts the encoding interval from a logarithm domain to the original number domain according to a method for approximate conversion between a logarithm and an original number.

For example, it is assumed that a value range of x is [0, 1]. In this case, the following mathematical relationship may be obtained: $2^x \approx X+1$ ($0<=x<=1$). According to the foregoing mathematical relation, conversion between the original number domain and the logarithm domain may be implemented.

Specifically, R1 and R2 are set to an interval value of the arithmetic encoding interval and an interval value of the first encoding interval in the original number domain respectively, and RLPS is set to an interval value of the second encoding interval in the original number domain. Therefore, it can be known according to an arithmetic encoding principle that: $RLPS \approx R1-R2$. It can be known from the foregoing set values that, values of R1 and R2 in the logarithm domain are: $LG\_R1=-LOG(R1)$, and $LG\_R2=-LOG(R2)$.

Further, s1 and t1 are set to interval information of the arithmetic encoding interval, s2 and t2 are set to interval information of the first encoding interval, s1 is an integer not less than the arithmetic encoding interval in the logarithm domain, s2 is an integer not less than the first encoding interval in the logarithm domain, and t1 and t2 are both real numbers less than 1 and greater than or equal to 0. According to the foregoing values, formula 13 may be obtained:

$$LG_{-R1} = s1 - t1 (0 \le t1 < 1) \qquad \text{formula 13}$$

$$LG_{-R2} = s2 - t2 (0 \le t2 < 1).$$

For the values of R1 and R2 in the original number domain, the following formula 1 may be obtained by means of approximate calculation:

$$\begin{cases} R1 = 2^{-s1+t1} \approx (1+t1) \gg s1 \\ R2 = 2^{-s2+t2} \approx (1+t2) \gg s2 \end{cases} \qquad \text{formula 1}$$

Specifically, in formulas implemented in the present application, "$\gg$" denotes offset to right by X bits in binary calculation, and "$\ll$" denotes offset to left by X bits in binary calculation.

Because 0.5<PMPS<1, it can be known that: R1>R2>R1/2. It may be further obtained: LG_R1>LG_R2>LG_R1−1.

Therefore, with reference to the formula 13, the following formula 14 may be obtained:

$$\begin{cases} s1 - t1 < s2 - t2 \\ s2 - t2 < s1 - t1 + 1 \end{cases} \qquad \text{formula 14}$$

The formula 14 is simplified to obtain that t1−t2−1<s1−s2<t1−t2.

Because t1 and t2 are both values between 0 and 1, −1<t1−t2<1, and −2<s1−s2<1.

Therefore, it may be obtained: s1=s2 or s1=s2−1.

Because the interval value RLPS of the LPS is equal to $R1-R2=2^{-s1+t1}-2^{-s2+t2}$, with reference to s1=s2 or s1=s2−1, formula 15 may be obtained:

$$R_{LPS1} = 2^{-s2} \times \begin{cases} 2^{t1} - 2^{t2}, s1 = s2 \\ 2^{t1+1} - 2^{t2}, s1 = s2 - 1 \end{cases} \qquad \text{formula 15}$$

With reference to the formula 15, formula 2 may be obtained according to a method for approximate conversion between a logarithm and an original number:

$$R_{LPS1} = 2^{-s2} \times \begin{cases} t1 - t2, s1 = s2 \\ 1 + (t1 \ll 1) - t2, s1 = s2 - 1 \end{cases} \qquad \text{formula 2}$$

and $R_{LPS1}$ is an interval value of the second encoding interval before update in the original number domain.

207: Determine an interval value of an updated second encoding interval.

The interval value of the updated second encoding interval is determined according to a probability of the first encoding interval, interval information of the arithmetic encoding interval, and interval information of the first encoding interval.

For example, an arithmetic expression of $LG\_P_{MPS}$ is determined according to the interval information of the arithmetic encoding interval and the interval information of the first encoding interval (formula 3):

$$LG\_P_{MPS}=LG\_R1-LG\_R2=s1-t1-s2+t2. \qquad \text{formula 3}$$

Further, according to the formula 2 and the formula 3, a formula 4 may be obtained:

$$R_{LPS2} = 2^{-s2} \times \begin{cases} LG_{PMPS}, s1 = s2 \\ 1 + t1 + LG_{PMPS}, s1 = s2 - 1 \end{cases} \qquad \text{formula 4}$$

Further, a lower limit value of the updated second encoding interval further needs to be determined according to an interval value of the first encoding interval, as shown in the following formula 5:

$$low2=low1+R2=low+2^{-s2+t2}\approx low1+(1+t2)\gg s2. \qquad \text{formula 5}$$

208: Perform normalization processing on the second encoding interval in the original number domain.

After update on the second encoding interval is completed, the probability of the LPS is less than 0.5. Therefore, normalization processing needs to be performed at least once after update.

For example, normalization processing may be performed according to the foregoing formula 2, and specifically:

a left offset operation of binary calculation is performed on $2^{-s2}$ in the formula 2;

a left offset operation of binary calculation is performed on (t1−t2) or (1+t1<<1)−t2 in the formula 2; and when $2^{-s2}$ is offset to left by s2 bits, and (t1−t2) or (1+t1<<1)−t2 is offset to left by q bits, the second encoding interval is normalized, where q is an arithmetic precision of the encoding interval.

In the formula 2, a part $2^{-s2}$ may be normalized by being offset to left by s2 bits. A part (t1−t2) or (1+t1<<1)−t2 is maximally 1 in a register. In the case, q bits in total needs to be offset to left, and therefore it can be known that, when the LPS is normalized, a quantity of normalization times is s2+q. Because the precision of the arithmetic encoding interval is preset, and an interval is already normalized during MPS encoding, a quantity of interval normalization times depends on the interval precision during LPS encoding. For example, in this embodiment of the present application, a precision of an encoding interval is nine bits, and a value of the encoding interval during normalization is doubled compared with that before normalization. Therefore, it can be known that, a maximal quantity of normalization times needed by LPS encoding at the nine-bit precision is nine.

It should be noted that, a price of performing calculation by using a floating-point number in a computer system is relatively high. Therefore, variables involved in the foregoing arithmetic encoding method are all denoted by integer variables of a fixed precision. For example, t1 denotes a decimal value of an arithmetic encoding interval value in the logarithm domain, and during actual use, a value of t1 is denoted by using an eight-bit integer precision. Therefore, when the value of t1 is denoted by using the eight-bit precision, a value of an actual floating-point number of t1 is equal to the value of t1 divided by 256. For convenience of understanding, a method process executed by a computer system in an actual environment is described below:

In the present application, it is set that the arithmetic encoding interval is denoted by nine bits, and t1 and t2 are denoted by an eight-bit precision. Therefore, it can be known that, the expression form of the foregoing formula 1 may be changed to the following form:

$$\begin{cases} R1 = 2^{-s1+\frac{t1}{256}} \approx \left(1 + \frac{t1}{256}\right) \gg s1 \\ R2 = 2^{-s2+\frac{t2}{256}} \approx \left(1 + \frac{t2}{256}\right) \gg s2 \end{cases} \text{; and} \quad \text{formula 16}$$

and formula 17 may be obtained by performing derivation on the formula 1:

$$\begin{cases} 256 \times R1 = 256 \times 2^{-s1+t1/256} \approx (256 + t1) \gg s1 \\ 256 \times R2 = 256 \times 2^{-s2+t2/256} \approx (256 + t2) \gg s2 \end{cases}.$$

The arithmetic encoding interval is denoted by nine bits. Therefore, the foregoing formula 17 may be denoted as formula 18:

$$\begin{cases} R1 \approx (256 + t1) \gg s1 \\ R2 \approx (256 + t2) \gg s2 \end{cases}$$

Therefore, when t1 and t2 are denoted by using the eight-bit precision, the following may be obtained according to the formula $LG\_R2_{(2)} = LG\_R2_{(1)} + LG\_P_{MPS}$ and deduction s1=s2 or s1=s2−1 of the formula 14:

If t1 is greater than or equal to $LG\_P_{MPS}$, s2=s1, and therefore t2=t1−$LG\_P_{MPS}$ may be obtained; or if t1 is less than $LG\_P_{MPS}$, s2=s1+1, and therefore t2=256+t1−$LG\_P_{MPS}$ may be obtained; and in a bypass mode, s2=s1+1 and t2=t1.

Moreover, considering that a higher precision of $LG\_P_{MPS}$ indicates better performance of arithmetic encoding in a logarithm domain, $LG\_P_{MPS}$ is generally denoted by using an integer of a higher precision, for example, a 10-bit precision. If $LG\_P_{MPS}\_SHIFTNO$ is a quantity of bits by which $LG\_P_{MPS}$ is greater than t1 and t2, the foregoing conclusion may be denoted as:

if t1 is greater than or equal to $LG\_P_{MPS} \gg LG\_P_{MPS}\_SHIFTNO$, s2=s1, and therefore t2=t1−$LG\_P_{MPS}$ may be obtained; or if t1 is less than $LG\_P_{MPS} \gg LG\_P_{MPS}\_SHIFTNO$, s2=s1+1, and therefore t2=256+t1−($LG\_P_{MPS} \gg LG\_P_{MPS}\_SHIFTNO$) may be obtained; and in a bypass mode, s2=s1+1 and t2=t1.

After encoding on the MPS is completed, interval update is performed, and values of s2 and t2 are assigned to s1 and t1.

It can be known according to the formula 18 that when s1 is greater than 0, the value of R1 is inevitably less than 256. Therefore, it can be known that in this case, after encoding on the MPS is completed, the interval value is less than the arithmetic encoding interval value (512) denoted by nine bits. In this case, a normalization operation needs to be performed. Therefore, whether a normalization operation needs to be performed after encoding on the MPS is completed may be determined according to the updated value sa.

Likewise, when t1 and t2 are denoted by the eight-bit precision, and $LG\_P_{MPS}\_SHIFTNO$ is a quantity of bits by which $LG\_P_{MPS}$ is greater than t1 and t2, after encoding on the LPS is completed, the interval value of the LPS is:

$$R_{LPS2} = 2^{-s2} \times \begin{cases} LG_{PMPS} \gg LG_{PMPS\,SHIFTNO}, s1 = s2 \\ 1 + t1 + (LG_{PMPS} \gg LG_{PMPS\,SHIFTNO}), s1 = s2 - 1 \end{cases}$$

It should be noted that, because a normalization operation inevitably needs to be performed after LPS encoding, and the interval is offset to left by s2+q bits after normalization, for a value of updated $R_{LPS2}$, a factor $2^{-s2}$ may not need to be considered. Therefore, the foregoing formula may be changed to:

$$R_{LPS2} = \begin{cases} LG_{PMPS} \gg LG_{PMPS\,SHIFTNO}, s1 = s2 \\ 1 + t1 + (LG_{PMPS} \gg LG_{PMPS\,SHIFTNO}), s1 = s2 - 1 \end{cases}$$

Therefore, it may be obtained that, after encoding on the LPS is completed, when a normalization operation is performed, the interval value $R_{LPS2}$ needs to be offset to left only by q bits, but a quantity of normalization operation times is still s2+q.

Optionally, for convenience of updating the first encoding interval for the MPS subsequently, the interval value updated in the original number domain may be converted to the logarithm domain. This is specifically implemented by using the formula 7.

If arithmetic encoding or decoding is performed in the bypass mode, in a case of using data encoding in this embodiment of the present application, data encoding efficiency can be further improved. Each binary symbol in a binary symbol string encoded by an arithmetic encoding engine is input in the bypass mode at a same probability, and generally the probability is set to 0.5. Therefore, during MPS encoding, the interval value of the encoding interval does not change, and a mathematical expression form of the interval value is:

during MPS encoding or decoding: R2=R1×0.5; and normalization operation: Rnew=R2<<1=R1×0.5<<1=R1.

Therefore, only a value of a pointer low needs to be changed: low=low<<1

When an LPS is encoded or decoded, update on an interval of the LPS is the same as that on the MPS, that is, the interval value does not change. Because a value of low is equal to low+R2=low+(R1>>1) during LPS encoding, the value of low is doubled after LPS encoding, that is, lownew=low<<1=(low<<1)+R1=(low<<1)+2−s1+t1.

Figure 3:
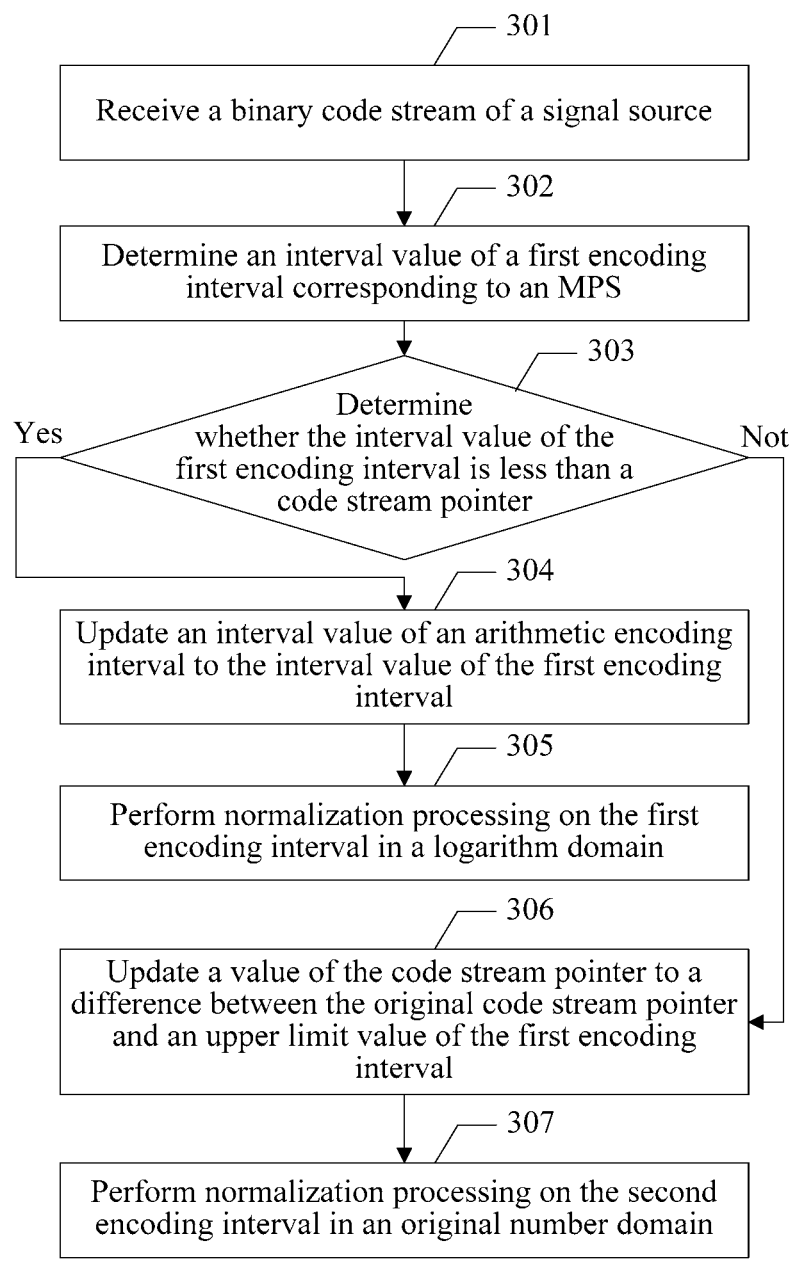
FIG. 3 is a schematic flowchart of a video data decoding method according to an embodiment of the present application.

A video data decoding method in an embodiment of the present application is described below. Referring to FIG. 3, an embodiment of the video data decoding method in this embodiment of the present application includes the following steps:

301: Receive a binary code stream of a signal source.

A data decoding apparatus receives the binary code stream of the signal source, and initializes an arithmetic encoding interval and a code stream pointer of the binary code stream, where the code stream pointer is an offset of a lower limit value of the arithmetic encoding interval.

Specifically, the binary code stream is a binary symbol after data encoding.

In this embodiment of the present application, the data decoding apparatus is a device that has a data decoding function in this embodiment of the present application, may specifically be a single physical device, including multiple physical modules, or may be a software program loaded into a computer, or a function module in software, or exist in a form of independent software or in a form of plug-in.

302: Determine an interval value of a first encoding interval corresponding to an MPS.

The data decoding apparatus determines, in a logarithm domain according to a probability of the most probable symbol (MPS) and the arithmetic encoding interval, the interval value of the first encoding interval corresponding to the MPS.

Specifically, the interval value of the first encoding interval corresponding to the MPS may be obtained by means of calculation according to formula 12.

$$LG\_R2=LG\_R1+LG\_P_{MPS}, \text{ where} \quad \text{Formula 12}$$

$LG\_P_{MPS}$ is a probability of the first encoding interval in the logarithm domain, and $LG\_R1$ and $LG\_R2$ are an interval value of the arithmetic encoding interval and an interval value of the first encoding interval in the logarithm domain respectively.

303: Determine whether the interval value of the first encoding interval is less than a code stream pointer.

The data decoding apparatus determines whether the code stream pointer is less than the interval value of the first encoding interval. If the code stream pointer is less than the interval value of the first encoding interval, step 304 is performed; or if the code stream pointer is not less than the interval value of the first encoding interval, step 306 is performed.

Specifically, if a current encoding interval is a logarithm domain, the encoding interval is converted from the logarithm domain to an original number domain according to a method for approximate conversion between a logarithm and an original number. A value to which the code stream pointer points is an offset of a lower limit value of the arithmetic encoding interval in the original number domain.

304: Update an interval value of an arithmetic encoding interval to the interval value of the first encoding interval.

When the code stream pointer is less than the interval value of the first encoding interval, it is determined that a binary symbol currently obtained by means of decoding is an MPS, and an interval value of the arithmetic encoding interval is updated to the interval value of the first encoding interval, where the code stream pointer does not change.

Optionally, before the interval value of the arithmetic encoding interval is updated to the interval value of the first encoding interval, the encoding interval may be converted from the original number domain to the logarithm domain.

305: Perform normalization processing on the first encoding interval in a logarithm domain.

Optionally, after update on the first encoding interval is completed, it is determined whether normalization processing needs to be performed on the first encoding interval. If the updated first encoding interval is less than one half of the arithmetic encoding interval, normalization processing is performed on the first encoding interval in the logarithm domain.

In this embodiment of the present application, after the first encoding interval is updated at least twice, the first encoding interval may be less than one half of the arithmetic encoding interval. When the first encoding interval is less than one half of the arithmetic encoding interval, normalization processing needs to be performed on the first encoding interval.

Specifically, the probability of the MPS is greater than 0.5. Therefore, after normalization is performed once (that is, the original encoding interval is doubled), the precision requirement of the encoding interval may be satisfied.

For example, specific normalization calculation may be implemented according to a formula 6.

The formula 6 is:

$$LG\_R2_{(2)}=LG\_R2_{(1)}-1, \text{ where}$$

$LG\_R2_{(2)}$ is an interval value of the normalized first encoding interval in the logarithm domain after normalization, and $LG\_R2_{(1)}$ is an interval value of the first encoding interval in the logarithm domain before normalization.

306: Update a value of the code stream pointer to a difference between the original code stream pointer and an upper limit value of the first encoding interval.

When the code stream pointer is greater than or equal to the interval value of the first encoding interval, it is determined that a binary symbol currently obtained by means of decoding is a least probable symbol (LPS), the encoding interval is switched to the original number domain, an interval value of the arithmetic encoding interval is updated to an interval value of a second encoding interval corresponding to the LPS, and a value of the code stream pointer is updated to a difference between the original code stream pointer and an upper limit value of the first encoding interval.

Specifically, for a method for updating a value of the code stream pointer to a difference between the original code stream pointer and an upper limit value of the first encoding interval, refer to formula 11:

$$\text{offset}_{new}=\text{offset}-R2, \text{ where} \quad \text{formula 11}$$

offset_new is a value of the updated code stream pointer, offset is a value of the code stream pointer, and R2 is an interval value of an encoding interval corresponding to an MPS; and specifically, to satisfy a precision requirement of the formula 11, during specific calculation, the value R2 is expanded by s2 times, and the value offset is correspondingly expanded by s2 times.

Specifically, if a current encoding interval is a logarithm domain, the encoding interval is converted from the logarithm domain to an original number domain according to a method for approximate conversion between a logarithm and an original number.

Specifically, the current interval value of the arithmetic encoding interval is R1, the current offset is offset, $p_{LPS}$ denotes a probability of an LPS, $p_{MPS}$ denotes a probability of an MPS, and $p_{LPS}+p_{MPS}-1$. The value RLPS and the value offset of the interval are updated as follows:

$$R_{LPS}=R1-R1\times N_{LPS}; \text{ and}$$

$$\text{offset}_{n+1}=\text{offset}_n-R_n\times p_{MPS}$$

307: Perform normalization processing on the second encoding interval in the original number domain.

After update on the second encoding interval is completed, the probability of the LPS is less than 0.5. Therefore, normalization processing needs to be performed at least more than once after update.

Specifically, the lower limit value of the encoding interval of the LPS is the upper limit value of the first encoding interval. Therefore, when update or a normalization operation is performed on the second encoding interval, the value offset needs to be updated according to the upper limit value of the first encoding interval.

Specifically, the interval value of the second encoding interval converted to the original number domain is denoted by using 2 to the power of X. Therefore, when a computer performs normalization calculation, shift calculation may be performed in a binary manner.

Optionally, for convenience of updating the first encoding interval for the MPS subsequently, the interval value updated in the original number domain may be converted to the logarithm domain. This is specifically implemented by using the formula 7.

In this embodiment of the present application, after a binary code stream of a signal source is received, whether the binary symbol is an MPS or an LPS is confirmed, and when it is confirmed that the binary symbol is an MPS, arithmetic encoding is performed in a logarithm domain. MPS interval update is performed by using a logarithm, so that a multiplication operation is replaced with an addition operation during calculation. When it is confirmed that the binary symbol is an LPS, arithmetic encoding is performed in an original number domain.

In the prior art, the value offset is denoted by using information offset_s and offset_t in a logarithm domain. In this way, during LPS decoding, conversion from the logarithm domain to an original number domain needs to be performed, and after LPS decoding, conversion from the original number domain to the logarithm domain needs to be performed. This frequent conversion operation does not facilitate implementation of a hardware arithmetic decoder, and when an offset precision is very high, the implementation is more difficult. In this embodiment of the present application, because the offset is always in the original number domain, the frequent conversion operation is avoided, thereby facilitating hardware implementation.

Figure 4:
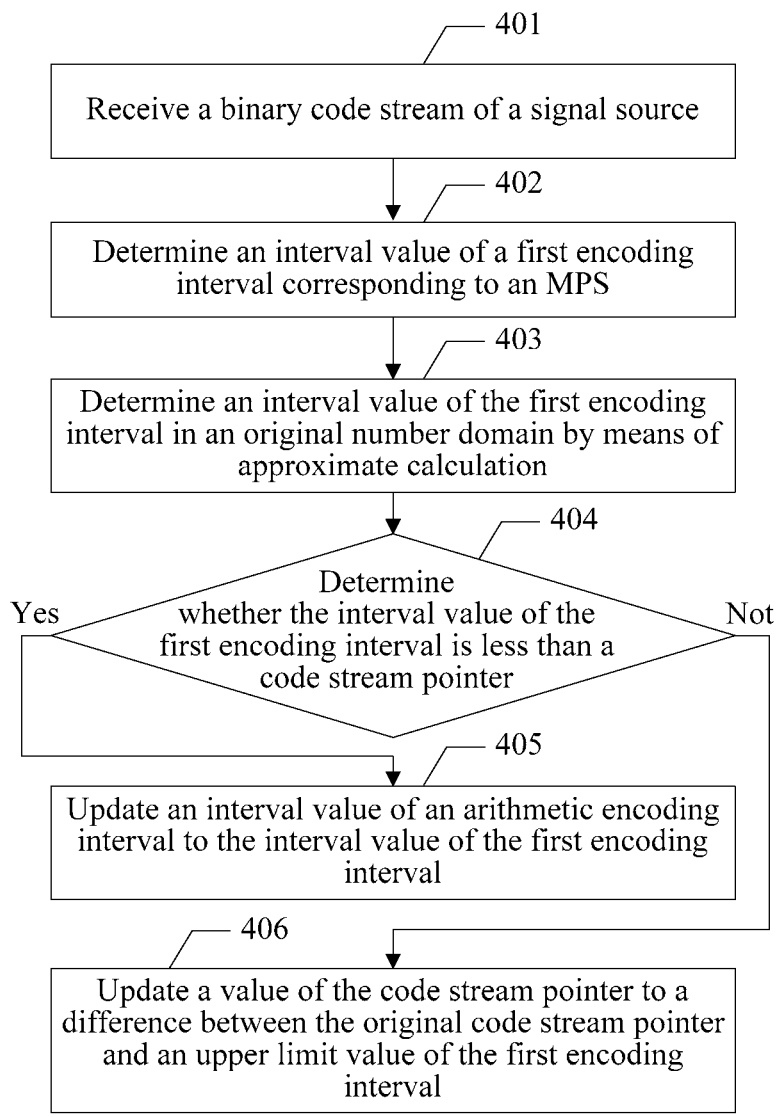
FIG. 4 is another schematic flowchart of a video data decoding method according to an embodiment of the present application.

Optionally, a video data decoding method in an embodiment of the present application may be further implemented in a logarithm domain. Referring to FIG. 4, another embodiment of the video data decoding method in this embodiment of the present application includes the following steps:

401: Receive a binary code stream of a signal source.

A data decoding apparatus receives the binary code stream of the signal source, and initializes an arithmetic encoding interval and a code stream pointer of the binary code stream, where the code stream pointer is an offset of a lower limit value of the arithmetic encoding interval.

Specifically, the binary code stream is a binary symbol after data encoding.

In this embodiment of the present application, the data decoding apparatus is a device that has a data decoding function in this embodiment of the present application, may specifically be a single physical device, including multiple physical modules, or may be a software program loaded into a computer, or a function module in software, or exist in a form of independent software or in a form of plug-in.

402: Determine an interval value of a first encoding interval corresponding to the MPS.

The data decoding apparatus determines, in a logarithm domain according to a probability of the most probable symbol (MPS) and the arithmetic encoding interval, the interval value of the first encoding interval corresponding to the MPS.

Specifically, an interval value of the encoding interval corresponding to the MPS in the logarithm domain satisfies the following formula 7:

$$LG\_R2=LG\_R1+LG\_P_{MPS}, \text{ where} \qquad \text{formula 7}$$

$LG\_P_{MPS}$ is a probability of the first encoding interval in the logarithm domain, and LG_R1 and LG_R2 are an interval value of the arithmetic encoding interval and an interval value of the first encoding interval in the logarithm domain respectively; and the interval value of the first encoding interval corresponding to the MPS may be obtained by means of calculation according to the formula 7.

403: Determine an interval value of the first encoding interval in an original number domain by means of approximate calculation.

The data decoding apparatus determines the interval value of the first encoding interval corresponding to the MPS in the original number domain according to s2 and t2 of the first encoding interval corresponding to the MPS in the logarithm domain by means of approximate calculation.

Specifically, an interval value of the encoding interval corresponding to the MPS in the logarithm domain satisfies the following formula 10:

$$R2\approx(1+t2)>>s2, \text{ where} \qquad \text{formula 10}$$

R2 is an interval value of an encoding interval corresponding to an MPS, s2 and t2 are interval information of the first encoding interval, s2 is an integer not less than the first encoding interval in the logarithm domain, and t2 is a real number less than 1 and greater than or equal to 0.

404: Determine whether the interval value of the first encoding interval is less than a code stream pointer.

The data decoding apparatus determines whether the code stream pointer is less than the interval value of the first encoding interval. If the code stream pointer is less than the interval value of the first encoding interval, step 405 is performed; or if the code stream pointer is not less than the interval value of the first encoding interval, step 406 is performed.

Specifically, determining is performed according to offset and the value R2 in the formula 10. A value to which the code stream pointer offset points is an offset of a lower limit value of the arithmetic encoding interval in the original number domain.

405: Update an interval value of an arithmetic encoding interval to the interval value of the first encoding interval.

If the code stream pointer is less than the interval value of the first encoding interval in the logarithm domain, it is determined that a binary symbol currently obtained by means of decoding is an MPS, and the interval value of the arithmetic encoding interval is updated to the interval value of the first encoding interval, where the code stream pointer does not change.

406: Update a value of the code stream pointer to a difference between the code stream pointer and an upper limit value of the first encoding interval.

If the code stream pointer is greater than or equal to the interval value of the first encoding interval in the logarithm domain, it is determined that a binary symbol currently obtained by means of decoding is a least probable symbol (LPS), the encoding interval is switched to the original number domain, an interval value of the arithmetic encoding interval is updated to an interval value of a second encoding interval corresponding to the LPS, and a value of the code stream pointer is updated to the code stream pointer minus an upper limit value of the first encoding interval.

Specifically, the switching the encoding interval to the original number domain, and updating an interval value of the arithmetic encoding interval to an interval value of a second encoding interval corresponding to the LPS includes:

A sub-interval RLPS corresponding to the LPS has a value of R1-R2, and therefore, the following is obtained by means of derivation during encoding:

$$R_{LPS} \approx 2^{-s2} \times \begin{cases} t1 - t2, s2 = s1 \\ 1 + (t1 \ll 1) - t2, s2 = s1 + 1 \end{cases}.$$

When s2=s1, t1−t2=LG_P$_{MPS}$; and when s2=s1+1, 1+t1−t2=LG_P$_{MPS}$. Therefore, the following formula 4 may be obtained by means of derivation according to the foregoing formula:

$$R_{LPS} = 2^{-s2} \times \begin{cases} LG_{P_{MPS}}, s1 = s2 \\ 1 + t1 + LG_{P_{MPS}}, s1 = s2 - 1 \end{cases}, \quad \text{formula 4}$$

where

RLPS is an interval value of the updated second encoding interval in the original number domain, LG_P$_{MPS}$ is a probability of the first encoding interval in the logarithm domain, s1 and t1 are interval information of the arithmetic encoding interval, s2 and t2 are interval information of the first encoding interval, s1 is an integer not less than the arithmetic encoding interval in the logarithm domain, s2 is an integer not less than the first encoding interval in the logarithm domain, and t1 and t2 are both real numbers less than 1 and greater than or equal to 0.

According to the formula 4, the interval value of the updated second encoding interval in the original number domain is obtained by means of calculation.

Optionally, for convenience of updating the first encoding interval for the MPS subsequently, the interval value updated in the original number domain may be converted to the logarithm domain. This is specifically implemented by using the formula 7.

Specifically, for the updating a value of the code stream pointer to the code stream pointer minus an upper limit value of the first encoding interval, refer to a formula 10 and a formula 11:

$$R2 \approx (1+t2) \gg s2; \quad \text{formula 10}$$

$$\text{offset}_{new} = \text{offset} - R2, \text{ where} \quad \text{formula 11}$$

offset_new is the updated code stream pointer, offset is the value of the code stream pointer, R2 is an interval value of an encoding interval corresponding to an MPS, s2 and t2 are interval information of the first encoding interval, s2 is an integer not less than the first encoding interval in the logarithm domain, and t2 is a real number less than 1 and greater than or equal to 0;

specifically, to satisfy a precision requirement of the formula 11, during specific calculation, the value R2 is expanded by s2 times, and the value offset is correspondingly expanded by s2 times.

According to the formula 11, a value of the updated code stream pointer is obtained by means of calculation.

In an actual application, RLPS and offset are both offset to left. Therefore, the same factor $2^{-S_2}$ may be not taken into account. Specifically, during data decoding, code executed by a computer when updating an encoding interval may be:

First, offset to left is performed, so that a most significant bit of range is '1' while (RLPS<0x100) {

RLPS=RLPS<<1;

Offset=(offset<<1)|readbit(1);

}

After completion, integral and decimal parts of LG_R$_1$ are updated:

s1=0; and t1=low eight bits of RLPS.

A data decoding method in an embodiment of the present application is described below. Referring to FIG. 4, an embodiment of bypass decoding of the data decoding method in this embodiment of the present application includes the following steps:

401: Receive a binary code stream of a signal source, and initialize an arithmetic encoding interval and a code stream pointer of the binary code stream.

A data decoding apparatus receives the binary code stream of the signal source, and initializes an arithmetic encoding interval and a code stream pointer of the binary code stream, where the code stream pointer is an offset of a lower limit value of the arithmetic encoding interval.

Specifically, the binary code stream is a binary symbol after data encoding.

In this embodiment of the present application, the data decoding apparatus is a device that has a data decoding function in this embodiment of the present application, may specifically be a single physical device, including multiple physical modules, or may be a software program loaded into a computer, or a function module in software, or exist in a form of independent software or in a form of plug-in.

402: Determine whether the code stream pointer is in an original number domain or in a logarithm domain, and if the code stream pointer is in an original number domain, perform 403, or if the code stream pointer is in a logarithm domain, perform 407.

403: Determine an absolute value of a first encoding interval corresponding to an MPS in the original number domain according to an absolute value of the arithmetic encoding interval;

s2=s1+1; and t2=t1.

Specifically, an absolute value of the encoding interval corresponding to the MPS in the logarithm domain satisfies the following formula 10:

$$R2 \approx (1+t2) >> s2, \text{ where} \quad \text{formula 10}$$

R2 is an absolute value of an encoding interval corresponding to an MPS, s2 and t2 are interval information of the first encoding interval, s2 is an integer not less than the first encoding interval in the logarithm domain, and t2 is a real number less than 1 and greater than or equal to 0. To keep a calculation precision, R2 in the formula 10 is expanded by s2 times, and the code stream pointer is also expanded by s2 times.

while (R2) {
R2≈(1+t2)
offset=offset<<1|readbit(1);
}

404: Determine whether the absolute value of the first encoding interval is less than the code stream pointer.

The data decoding apparatus determines whether the code stream pointer is less than the absolute value of the first encoding interval. If the code stream pointer is less than the absolute value of the first encoding interval, step 405 is performed; or if the code stream pointer is not less than the absolute value of the first encoding interval, step 406 is performed.

Specifically, determining is performed according to offset and the value R2 in the formula 11. A value to which the code stream pointer offset points is an offset of a lower limit value of the arithmetic encoding interval in the original number domain.

405: Update the absolute value of the arithmetic encoding interval to the absolute value of the first encoding interval.

If the current code stream pointer is less than the absolute value of the first encoding interval in the logarithm domain, it is determined that a binary symbol currently obtained by means of decoding is an MPS, the absolute value of the arithmetic encoding interval does not change, and the code stream pointer does not change.

406: Update a value of the code stream pointer to the code stream pointer minus an upper limit value of the first encoding interval.

If the current code stream pointer is greater than or equal to the absolute value of the first encoding interval in the logarithm domain, it is determined that a binary symbol currently obtained by means of decoding is a least probable symbol (LPS) the absolute value of the arithmetic encoding interval does not change, and the value of the code stream pointer is updated to the code stream pointer minus the upper limit value of the first encoding interval.

Specifically, $$\text{offset}_{new} = \text{offset} - R2 \quad \text{formula 11}$$

specifically, to satisfy a precision requirement of the formula 11, during specific calculation, the value R2 is expanded by s2 times, and the value offset is correspondingly expanded by s2 times; and offset_new is the updated code stream pointer, and offset and R2 are values in the formula 11. According to the formula 11, a value of the updated code stream pointer is obtained by means of calculation.

407: Determine, in a logarithm domain according to a probability of a most probable symbol (MPS) and the arithmetic encoding interval, an absolute value of a first encoding interval corresponding to the MPS.

The data decoding apparatus determines, in the logarithm domain according to the probability of the most probable symbol (MPS) and the arithmetic encoding interval, the absolute value of the first encoding interval corresponding to the MPS.

Specifically, an absolute value of the encoding interval corresponding to the MPS in the logarithm domain satisfies the following formula 12:

$$LG\_R2 = LG\_R1 + LG\_P_{MPS}, \text{ where} \quad \text{formula 12}$$

$LG\_P_{MPS}$ is a probability of the first encoding interval in the logarithm domain, and $LG\_R1$ and $LG\_R2$ are an absolute value of the arithmetic encoding interval and an absolute value of the first encoding interval in the logarithm domain respectively; and according to the formula 9, the absolute value of the first encoding interval corresponding to the MPS is obtained by means of calculation.

408: Determine whether the absolute value of the first encoding interval is greater than the code stream pointer.

The data decoding apparatus determines whether the absolute value of the first encoding interval is less than the code stream pointer. If the absolute value of the first encoding interval is less than the code stream pointer, step 409 is performed; or if the absolute value of the first encoding interval is not less than the code stream pointer, step 410 is performed.

409: Update the absolute value of the arithmetic encoding interval to the absolute value of the first encoding interval.

If the current absolute value of the first encoding interval is greater than the code stream pointer in the logarithm domain, it is determined that a binary symbol currently obtained by means of decoding is an MPS, and the absolute value of the arithmetic encoding interval is updated to the absolute value of the first encoding interval, where the code stream pointer does not change.

410: Update the value of the code stream pointer to a lower limit value of a second encoding interval.

If the current absolute value of the first encoding interval is less than or equal to the code stream pointer in the logarithm domain, it is determined that a binary symbol currently obtained by means of decoding is a least probable symbol (LPS), the encoding interval is switched to the original number domain, an absolute value of the arithmetic encoding interval is updated to an absolute value of the second encoding interval corresponding to the LPS, and the value of the code stream pointer is updated to the lower limit value of the second encoding interval.

Specifically, the switching the encoding interval to the original number domain, and updating an absolute value of the arithmetic encoding interval to an absolute value of a second encoding interval corresponding to the LPS includes:

A sub-interval RLPS corresponding to the LPS has a value of R1−R2. Therefore, the following is obtained by means of derivation during encoding:

$$R_{LPS} \approx 2^{-s2} \times \begin{cases} t1 - t2, & s2 = s1 \\ 1 + (t1 \ll 1) - t2, & s2 = s1 + 1 \end{cases}$$

When s2=s1, t1−t2=LG_P$_{MPS}$; and when s2=s1+1, 1+t1−t2=LG_P$_{MPS}$. Therefore, the following formula 4 may be obtained by means of derivation according to the foregoing formula:

$$R_{LPS} = 2^{-s2} \times \begin{cases} LG\_PMPS, s1 = s2 \\ 1 + t1 + LG\_PMPS, s1 = s2 - 1 \end{cases}, \quad \text{formula 4}$$

where

RLPS is an absolute value of the updated second encoding interval in the original number domain, LG_P$_{MPS}$ is a probability of the first encoding interval in the logarithm domain, s1 and t1 are interval information of the arithmetic encoding interval, s2 and t2 are interval information of the first encoding interval, s1 is an integer not less than the arithmetic encoding interval in the logarithm domain, s2 is an integer not less than the first encoding interval in the logarithm domain, and t1 and t2 are both real numbers less than 1 and greater than or equal to 0.

According to the formula 4, the absolute value of the updated second encoding interval in the original number domain is obtained by means of calculation.

Specifically, for the updating a value of the code stream pointer to the original code stream pointer minus an upper limit value of the first encoding interval, refer to a formula 19:

$$\text{offset} \approx \quad \text{formula 19}$$
$$2^{-s2} \times \begin{cases} \text{value}_t - t2, s2 = \text{value}\_s \\ 1 + (\text{vlaue}_t \ll 1) | \text{readbit}(1) - t2, s2 = \text{value}_s + 1 \end{cases},$$

where offset is the code stream pointer, value_s and value$_t$ are interval information of the code stream pointer, value_s is an integer not less than the code stream pointer in the logarithm domain, and value$_t$ is a real number less than 1 and greater than or equal to 0;

specifically, a left offset operation of binary calculation is performed on $2^{-s2}$ in the formula 19; and a left offset operation of binary calculation is also performed on $2^{-s2}$ in the formula 4.

According to the formula 19, the original code stream pointer minus the upper limit value of the first encoding interval is obtained by means of calculation.

Figure 5:
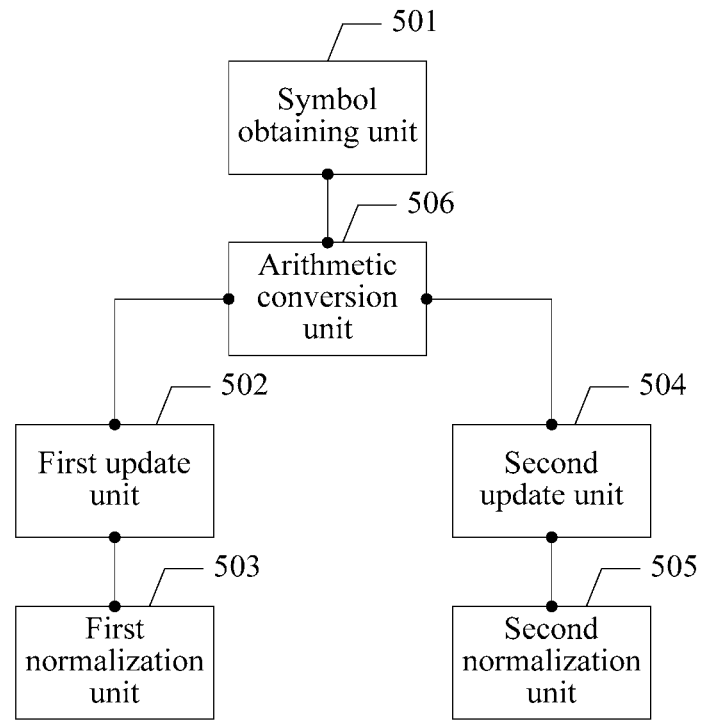
FIG. 5 is a schematic structural diagram of a data encoding apparatus according to an embodiment of the present application.

A data encoding apparatus for implementing a video data encoding method in an embodiment of the present application is described below. It should be noted that, methods recorded in embodiments of the foregoing data encoding method may be applied to the data encoding apparatus of the present application. Referring to FIG. 5, an embodiment of a data encoding apparatus in an embodiment of the present application includes:

a symbol obtaining unit 501, configured to obtain a binary symbol of image data;

a first update unit 502, configured to: if the binary symbol is a most probable symbol (MPS), update a first encoding interval corresponding to the MPS in a logarithm domain;

a first normalization unit 503, configured to: if the updated first encoding interval is less than a preset range of an arithmetic encoding interval, perform normalization processing on the first encoding interval in the logarithm domain;

a second update unit 504, configured to: if the binary symbol is a least probable symbol (LPS) update a second encoding interval corresponding to the LPS in an original number domain; and a second normalization unit 505, configured to perform normalization processing on the second encoding interval in the original number domain.

Further, the apparatus further includes:

an arithmetic conversion unit 506, configured to: if a current encoding interval is an original number domain, convert the encoding interval from the original number domain to a logarithm domain according to a method for approximate conversion between a logarithm and an original number.

The arithmetic conversion unit is further configured to: if a current encoding interval is a logarithm domain, convert the encoding interval from the logarithm domain to an original number domain according to a method for approximate conversion between a logarithm and an original number.

Specifically, the second update unit 504 is specifically configured to:

determine an interval value of the updated second encoding interval according to a probability of the first encoding interval, interval information of the arithmetic encoding interval, and interval information of the first encoding interval.

Specifically, the second update unit 504 is specifically further configured to:

determine a lower limit value of the updated second encoding interval according to an interval value of the first encoding interval.

Specifically, the arithmetic conversion unit 506 is specifically configured to:

$$\begin{cases} R1 = 2^{-s1+t1} \approx (1+t1) \gg s1 \\ R2 = 2^{-s2+t2} \approx (1+t2) \gg s2 \end{cases}; \text{ and} \quad \text{formula 1}$$

$$R_{LPS1} = 2^{-s2} \times \begin{cases} t1 = t2, s1 = s2 \\ 1 + (t1 \ll 1) - t2, s1 = s2 - 1 \end{cases}, \quad \text{formula 2}$$

where

R1 and R2 are an interval value of the arithmetic encoding interval and an interval value of the first encoding interval in the original number domain respectively, s1 and t1 are interval information of the arithmetic encoding interval, s2 and t2 are interval information of the first encoding interval, s1 is an integer not less than the arithmetic encoding interval in the logarithm domain, s2 is an integer not less than the first encoding interval in the logarithm domain, and t1 and t2 are both real numbers less than 1 and greater than or equal to 0; and R$_{LPS1}$ is an interval value of the second encoding interval before update in the original number domain;

according to the formula 1, separately determine the interval value of the arithmetic encoding interval and the interval value of the first encoding interval in the original number domain according to the method for approximate conversion between a logarithm and an original number, the interval information of the arithmetic encoding interval, and the interval information of the first encoding interval; and according to the formula 2, determine an interval value of the updated second encoding interval according to the interval value of the arithmetic encoding interval and the interval value of the first encoding interval in the original number domain.

Further, the arithmetic conversion unit 506 is specifically further configured to:

$$LG\_P_{MPS} = LG\_R1 - LG\_R2 = s1 - t1 - s2 + t2; \quad \text{formula 3}$$

and $$R_{LPS2} = 2^{-s2} \times \begin{cases} LG_{PMPS}, & s1 = s2 \\ 1 + t1 + LG_{PMPS}, & s1 = s2 - 1 \end{cases}, \quad \text{formula 4}$$

where $LG\_P_{MPS}$ is a probability of the first encoding interval in the logarithm domain, and $LG\_R1$ and $LG\_R2$ are an interval value of the arithmetic encoding interval and an interval value of the first encoding interval in the logarithm domain respectively; and RLPS is an interval value of the updated second encoding interval in the original number domain;

according to the formula 3, determine an arithmetic expression of $LG\_P_{MPS}$ according to the interval information of the arithmetic encoding interval and the interval information of the first encoding interval; and according to the formula 4, perform conversion with reference to the formula 2 and the formula 3, to obtain an interval value of the updated second encoding interval.

Specifically, the second update unit 504 is specifically further configured to:

$$low2 = low1 + R2 = low + 2^{-s2+t2} \approx low1 + (1+t2) \gg s2 \quad \text{formula 5}$$

where low2 is a lower limit value of the updated second encoding interval in the original number domain, low1 is a lower limit value of the second encoding interval before update in the original number domain, and R2 is an interval value of the first encoding interval in the original number domain; and according to the formula 5, obtain an interval value of the updated second encoding interval according to the method for approximate conversion between a logarithm and an original number.

Specifically, the first normalization unit 503 is specifically configured to:

$$LG\_R2_{(2)} = LG\_R2_{(1)} + 1, \text{ where} \quad \text{formula 6}$$

$LG\_R2_{(2)}$ is an interval value of the normalized first encoding interval in the logarithm domain, and $LG\_R2_{(1)}$ is an interval value of the first encoding interval in the logarithm domain before normalization; and according to the formula 6, perform calculation to obtain the interval value of the normalized first encoding interval in the logarithm domain.

Specifically, the first update unit 502 is further configured to:

$$LG_{\_R1} = s1 - t1 (0 \le t1 < 1) \quad \text{formula 7}$$

$$LG_{\_R2} = s2 - t2 (0 \le t2 < 1),$$

where s1 and t1 are interval information of the arithmetic encoding interval, s2 and t2 are interval information of the first encoding interval, s1 is an integer not less than the arithmetic encoding interval in the logarithm domain, s2 is an integer not less than the first encoding interval in the logarithm domain, and t1 and t2 are both real numbers less than 1 and greater than or equal to 0;

after update on the first encoding interval is completed, according to the formula 7, assign values of s2 and t2 to s1 and t1.

Specifically, the first normalization unit 503 is specifically configured to: before normalization processing is performed on the first encoding interval in the logarithm domain, determine, according to updated s1, whether a normalization operation needs to be performed after encoding on the MPS is completed, and when s1 is greater than 0, perform a normalization operation on the first encoding interval.

Specifically, the second normalization unit 505 is specifically configured to:

perform a left offset operation of binary calculation on $2^{-s2}$ in the formula 4;

perform a left offset operation of binary calculation on (t1−t2) or (1+t1<<1)−t2 in the formula 4; and when $2^{-s2}$ is offset to left by s2 bits, and (t1−t2) or (1+t1<<1)−t2 is offset to left by q bits, normalize the second encoding interval, where q is an arithmetic precision of the encoding interval.

Specifically, the arithmetic conversion unit 506 is specifically further configured to:

$$\begin{cases} R1 \approx (256 + t1) \gg s1 \\ R2 \approx (256 + t2) \gg s2 \end{cases}, \quad \text{formula 8}$$

where

R1 and R2 are a value of the arithmetic encoding interval and a value of the first encoding interval in the original number domain respectively, s1 is interval information of the arithmetic encoding interval, s2 is interval information of the first encoding interval, s1 is an integer not less than the arithmetic encoding interval in the logarithm domain, and s2 is an integer not less than the first encoding interval in the logarithm domain; and when the arithmetic encoding interval is denoted by nine bits and t1 and t2 are denoted by an eight-bit precision, according to the formula 7, perform calculation to obtain a value of the second encoding interval before update.

Specifically, the second update unit 504 is specifically further configured to:

when a precision of $LG\_P_{MPS}$ is equal to the precision of t1, if t1 is greater than or equal to $LG\_P_{MPS}$, s2=s1 and t2=t1−$LG\_P_{MPS}$; or if t1 is less than $LG\_P_{MPS}$, s2=s1+1 and t2=256+t1−$LG\_P_{MPS}$; and in a bypass mode, s2=s1+1 and t2=t1, where $LG\_P_{MPS}$ is a probability of the first encoding interval in the logarithm domain, t1 is the interval information of the arithmetic encoding interval, t2 is the interval information of the first encoding interval, and t1 and t2 are both real numbers less than 1 and greater than or equal to 0.

Specifically, the second update unit 504 is specifically further configured to:

when a precision of $LG\_P_{MPS}$ is greater than the precision of t1, if t1 is greater than or equal to $LG\_P_{MPS}$>>$LG\_P_{MPS}$_SHIFTNO, s2=s1 and t2=t1−$LG\_P_{MPS}$; or if t1 is less than $LG\_P_{MPS}$>>$LG\_P_{MPS}$_SHIFTNO, s2=s1+1, t2=256+t1−($LG\_P_{MPS}$>>$LG\_P_{MPS}$_SHIFTNO); and in a bypass mode, s2=s1+1 and t2=t1, where $LG\_P_{MPS}$ is a probability of the first encoding interval in the logarithm domain, t1 is the interval information of the arithmetic encoding interval, t2 is the interval information of the first encoding interval, t1 and t2 are both real numbers less than 1 and greater than or equal to 0, and LG_P$_{MPS}$_SHIFTNO is a difference between LG_P$_{MPS}$ and a quantity of bits of t1 and t2.

Specifically, the second normalization unit 505 is specifically further configured to:

when the arithmetic encoding interval is denoted by nine bits, t1 and t2 are denoted by an eight-bit precision, and a precision of LG_P$_{MPS}$ is greater than a precision of t1, normalize the second encoding interval to satisfy the formula 8;

$$R_{LPS2} = \begin{cases} LG_{PMPS} \gg LG_{PMPS_{SHIFTNO}}, s1 = s2 \\ 1 + t1 + (LG_{PMPS} \gg LG_{PMPS_{SHIFTNO}}), s1 = s2 - 1 \end{cases} \quad \text{formula 9}$$

and perform a left offset operation of binary calculation on $2^{-s2}$ in the formula 4;

perform a left offset operation of binary calculation on (t1−t2) or (1+t1<<1)−t2 in the formula 4; and when $2^{-s2}$ is offset to left by s2 bits, and (t1−t2) or (1+t1<<1)−t2 is offset to left by q bits, normalize the second encoding interval, where q is an arithmetic precision of the encoding interval, and LG_P$_{MPS}$_SHIFTNO is a difference between LG_P$_{MPS}$ and a quantity of bits of t1 and t2.

Operation processes of the foregoing units are described below:

The symbol obtaining unit 501 receives a binary symbol of a signal source.

Specifically, the binary symbol may be signal data obtained after binarization processing is performed on a to-be-encoded element such as an image unit mode, an intra-frame prediction mode, a residual coefficient, or a motion vector.

The arithmetic conversion unit 506 determines whether the current encoding interval is a logarithm domain, and if the current encoding interval is not a logarithm domain, converts the encoding interval from the original number domain to a logarithm domain according to a method for approximate conversion between a logarithm and an original number.

For example, it is assumed that a value range of x is [0, 1]. In this case, the following mathematical relationship may be obtained: LOG(1+x)≈x (0<=x<=1). Conversion between the original number domain and the logarithm domain may be implemented according to the foregoing mathematical relation. It should be noted that the foregoing approximate equation holds within a precision range. In the present application, the precision of the foregoing approximate equation can satisfy a requirement of the present application on a calculation precision.

Specifically, in an actual application, by using a conversion method for approximate calculation between a logarithm and an original number, a table lookup operation may be avoided, thereby further improving data encoding efficiency.

After it is determined that the binary symbol is an MPS, the first update unit 502 updates the first encoding interval corresponding to the MPS in the logarithm domain.

Specifically, the first encoding interval denotes an encoding interval corresponding to the encoded MPS, and the second encoding interval denotes an encoding interval corresponding to the encoded LPS. Moreover, the arithmetic encoding interval is a variable maintained by the data encoding apparatus, and is a complete encoding interval initially, and a sum of the first encoding interval and the second encoding interval is equal to or approximately equal to the arithmetic encoding interval.

The current arithmetic encoding interval is denoted by using an interval value R1 and a lower limit value low of the current arithmetic encoding interval, p$_{LPS}$ denotes a probability of the LPS, p$_{MPS}$ denotes a probability of the MPS, and p$_{LPS}$+p$_{MPS}$−1. The value R1 and the value low of the interval are updated as follows:

$$R2 = R1 \times p_{MPS}; \text{ and}$$

$$\text{low}_{n+1} = \text{low}_n.$$

For example, the first encoding interval may be updated in the logarithm domain according to the following formula:

$$LG\_R2_{(2)} = LG\_R2_{(1)} + LG\_P_{MPS}, \text{ where}$$

LG_R2$_{(2)}$ is an interval value of the updated first encoding interval in the logarithm domain, LG_R2$_{(1)}$ is an interval value of the first encoding interval before update in the logarithm domain, and LG_P$_{MPS}$ is a probability of the first encoding interval in the logarithm domain.

Specifically, the lower limit value of the encoding interval of the MPS does not change. Therefore, when update or a normalization operation is performed on the first encoding interval, the value low corresponding to the first encoding interval does not change.

After update on the first encoding interval is completed, the first normalization unit 503 determines whether normalization processing needs to be performed on the first encoding interval, and if the updated first encoding interval is less than a preset range of the arithmetic encoding interval, performs normalization processing on the first encoding interval in the logarithm domain.

Specifically, a principle of normalization is: after an encoding interval reaches a precision lower limit, the interval value and the value low of the encoding interval are doubled, and then whether the interval value of the encoding interval satisfies a precision requirement is determined. If the interval value of the encoding interval does not satisfy the precision requirement, a normalization operation continues to be performed until it is ensured that the interval value of the encoding interval satisfies the precision requirement.

In this embodiment of the present application, after the first encoding interval is updated at least twice, the first encoding interval may be less than one half of the arithmetic encoding interval. When the first encoding interval is less than one half of the arithmetic encoding interval, normalization processing needs to be performed on the first encoding interval.

Specifically, the probability of the MPS is greater than 0.5. Therefore, after normalization is performed once (that is, the original encoding interval is doubled), the precision requirement of the encoding interval may be satisfied.

For example, specific normalization calculation may be implemented according to a formula 6.

The formula 6 is:

$$LG\_R2_{(2)} = LG\_R2_{(1)} + 1, \text{ where}$$

LG_R2$_{(2)}$ is an interval value of the normalized first encoding interval in the logarithm domain, and LG_R2$_{(1)}$ is an interval value of the first encoding interval in the logarithm domain before normalization.

The arithmetic conversion unit 506 determines whether the current encoding interval is an original number domain, and if the current encoding interval is not an original number domain, converts the encoding interval from the logarithm domain to an original number domain according to a method for approximate conversion between a logarithm and an original number.

For example, it is assumed that a value range of x is [0, 1]. In this case, the following mathematical relationship may be obtained: $2^X \approx X+1$ ($0<=x<=1$). According to the foregoing mathematical relation, conversion between the original number domain and the logarithm domain may be implemented.

Specifically, R1 and R2 are set to an interval value of the arithmetic encoding interval and an interval value of the first encoding interval in the original number domain respectively, and RLPS is set to an interval value of the second encoding interval in the original number domain, it can be known according to an arithmetic encoding principle that: RLPS≈R1−R2. It can be known from the foregoing set values that, values of R1 and R2 in the logarithm domain are: LG_R1=−LOG(R1), and LG_R2=−LOG(R2).

Further, s1 and t1 are set to interval information of the arithmetic encoding interval, s2 and t2 are set to interval information of the first encoding interval, s1 is an integer not less than the arithmetic encoding interval in the logarithm domain, s2 is an integer not less than the first encoding interval in the logarithm domain, and t1 and t2 are both real numbers less than 1 and greater than or equal to 0. According to the foregoing values, a formula 13 may be obtained:

$$\begin{aligned} LG_{-R1} &= s1 - t1 (0 \le t1 < 1) \\ LG_{-R2} &= s2 - t2 (0 \le t2 < 1) \end{aligned} \quad \text{formula 13}$$

where for the values of R1 and R2 in the original number domain, the following formula 1 may be obtained by means of approximate calculation:

$$\begin{cases} R1 = 2^{-s1+t1} \approx (1+t1) \gg s1 \\ R2 = 2^{-s2+t2} \approx (1+t2) \gg s2 \end{cases} \quad \text{formula 1}$$

Specifically, in formulas implemented in the present application, "»" denotes offset to right by X bits in binary calculation, and "«" denotes offset to left by X bits in binary calculation.

Because 0.5<PMPS<1, it can be known that: R1>R2>R1/2. It may be further obtained: LG_R1>LG_R2>LG_R1−1.

Therefore, with reference to the formula 13, the following formula 14 may be obtained:

$$\begin{cases} s1 - t1 < s2 - t2 \\ s2 - t2 < s1 - t1 + 1 \end{cases} \quad \text{formula 14}$$

The formula 14 is simplified to obtain that t1−t2−1<s1−s2<t1−t2.

Because t1 and t2 are both values between 0 and 1, −1<t1−t2<1, and −2<s1−s2<1. Therefore, it may be obtained: s1=s2 or s1=s2−1.

Because the interval value RLPS of the LPS is equal to R1−R2=$2^{-s1+t1}-2^{-s2+t2}$, with reference to s1=s2 or s1=s2−1, formula 15 may be obtained:

$$R_{LPS1} = 2^{-s2} \times \begin{cases} 2^{t1} - 2^{t2}, s1 = s2 \\ 2^{t1+1} - 2^{t2}, s1 = s2-1 \end{cases} \quad \text{formula 15}$$

With reference to the formula 15, a formula 2 may be obtained according to a method for approximate conversion between a logarithm and an original number:

$$R_{LPS1} = 2^{-s2} \times \begin{cases} t1 - t2, s1 = s2 \\ 1 + (t1 \ll 1) - t2, s1 = s2-1 \end{cases} \quad \text{formula 2}$$

where $R_{LPS1}$ is an interval value of the second encoding interval before update in the original number domain.

The second update unit 504 determines the interval value of the updated second encoding interval according to a probability of the first encoding interval, interval information of the arithmetic encoding interval, and interval information of the first encoding interval.

For example, an arithmetic expression of $LG\_P_{MPS}$ is determined according to the interval information of the arithmetic encoding interval and the interval information of the first encoding interval (formula 3):

$$LG\_P_{MPS} = LG\_R1 - LG\_R2 = s1 - t1 - s2 + t2. \quad \text{formula 3}$$

Further, according to the formula 2 and the formula 3, a formula 4 may be obtained:

$$R_{LPS2} = 2^{-s2} \times \begin{cases} LG_{PMPS}, s1 = s2 \\ 1 + t1 + LG_{PMPS}, s1 = s2-1 \end{cases} \quad \text{formula 4}$$

Further, a lower limit value of the updated second encoding interval further needs to be determined according to an interval value of the first encoding interval, as shown in the following formula 5:

$$low2 = low1 + R2 = low + 2^{s2+t2} \approx low1 + (1+t2) \gg s2. \quad \text{formula 5}$$

The second normalization unit 505 performs normalization processing on the second encoding interval in the original number domain.

After update on the second encoding interval is completed, the probability of the LPS is less than 0.5. Therefore, normalization processing needs to be performed at least once after update.

For example, normalization processing may be performed according to the foregoing formula 2. Specifically:

a left offset operation of binary calculation is performed on $2^{-s2}$ in the formula 2;

a left offset operation of binary calculation is performed on (t1−t2) or (1+t1«1)−t2 in the formula 2; and when $2^{-s2}$ is offset to left by s2 bits, and (t1−t2) or (1+t1«1)−t2 is offset to left by q bits, the second encoding interval is normalized, where q is an arithmetic precision of the encoding interval.

In the formula 2, a part $2^{-s2}$ may be normalized by being offset to left by s2 bits. A part (t1−t2) or (1+t1«1)−t2 is maximally 1 in a register. In the case, q bits in total needs to be offset to left. Therefore, it can be known that, when the LPS is normalized, a quantity of normalization times is s2+q. Because the precision of the arithmetic encoding interval is preset, and an interval is already normalized during MPS encoding, a quantity of interval normalization times depends on the interval precision during LPS encoding. For example, in this embodiment of the present application, a precision of an encoding interval is nine bits, and a value of the encoding interval during normalization is doubled compared with that before normalization. Therefore, it can be known that, a maximal quantity of normalization times needed by LPS encoding at the nine-bit precision is nine.

It should be noted that, a price of performing calculation by using a floating-point number in a computer system is relatively high. Therefore, variables involved in the foregoing arithmetic encoding method are all denoted by integer variables of a fixed precision. For example, t1 denotes a decimal value of an arithmetic encoding interval value in the logarithm domain, and during actual use, a value of t1 is denoted by using an eight-bit integer precision. Therefore, when the value of t1 is denoted by using the eight-bit precision, a value of an actual floating-point number of t1 is equal to the value of t1 divided by 256. For convenience of understanding, a method process executed by a computer system in an actual environment is described below:

In the present application, it is set that the arithmetic encoding interval is denoted by nine bits, and t1 and t2 are denoted by an eight-bit precision. Therefore, it can be known that, the expression form of the foregoing formula 1 may be changed to the following form:

$$\begin{cases} R1 = 2^{-s1+\frac{t1}{256}} \approx \left(1 + \frac{t1}{256}\right) \gg s1 \\ R2 = 2^{-s2+\frac{t2}{256}} \approx \left(1 + \frac{t2}{256}\right) \gg s2 \end{cases} \quad \text{formula 16}$$

Formula 17 may be obtained by performing derivation on the formula 1:

$$\begin{cases} 256 \times R1 = 256 \times 2^{-s1+t1/256} \approx (256 + t1) \gg s1 \\ 256 \times R2 = 256 \times 2^{-s2+t2/256} \approx (256 + t2) \gg s2 \end{cases}.$$

The arithmetic encoding interval is denoted by nine bits. Therefore, the foregoing formula 17 may be denoted as formula 18:

$$\begin{cases} R1 \approx (256 + t1) \gg s1 \\ R2 \approx (256 + t2) \gg s2 \end{cases}.$$

Therefore, when t1 and t2 are denoted by using the eight-bit precision, the following may be obtained according to the formula $LG\_R2_{(2)} = LG\_R2_{(1)} + LG\_P_{MPS}$ and deduction s1=s2 or s1=s2−1 of the formula 14:

If t1 is greater than or equal to $LG\_P_{MPS}$, s2=s1, and therefore $t2=t1-LG\_P_{MPS}$ may be obtained; or if t1 is less than $LG\_P_{MPS}$, s2=s1+1, and therefore $t2=256+t1-LG\_P_{MPS}$ may be obtained; and in a bypass mode, s2=s1+1 and t2=t1.

Moreover, considering that a higher precision of $LG\_P_{MPS}$ indicates better performance of arithmetic encoding in a logarithm domain. Therefore, $LG\_P_{MPS}$ is generally denoted by using an integer of a higher precision, for example, a 10-bit precision. If $LG\_P_{MPS}$ SHIFTNO is a quantity of bits by which $LG\_P_{MPS}$ is greater than t1 and t2, the foregoing conclusion may be denoted as:

If t1 is greater than or equal to $LG\_P_{MPS} \gg LG\_P_{MPS}\_SHIFTNO$, s2=s1, and therefore $t2=t1-LG\_P_{MPS}$ may be obtained; or if t1 is less than $LG\_P_{MPS} \gg LG\_P_{MPS}\_SHIFTNO$, s2=s1+1, and therefore $t2=256+t1-(LG\_P_{MPS} \gg LG\_P_{MPS}\_SHIFTNO)$ may be obtained; and in a bypass mode, s2=s1+1 and t2=t1.

After encoding on the MPS is completed, interval update is performed, and values of s2 and t2 are assigned to s1 and t1.

It can be known according to the formula 18 that when s1 is greater than 0, the value of R1 is inevitably less than 256. Therefore, it can be known that in this case, after encoding on the MPS is completed, the interval value is less than the arithmetic encoding interval value (512) denoted by nine bits. In this case, a normalization operation needs to be performed. Therefore, whether a normalization operation needs to be performed after encoding on the MPS is completed may be determined according to the updated value s1.

Likewise, when t1 and t2 are denoted by the eight-bit precision, and $LG\_P_{MPS}\_SHIFTNO$ is a quantity of bits by which $LG\_P_{MPS}$ is greater than t1 and t2, after encoding on the LPS is completed, the interval value of the LPS is:

$$R_{LPS2} = 2^{-s2} \times \begin{cases} LG_{PMPS} \gg LG_{PMPS_{SHIFTNO}}, s1 = s2 \\ 1 + t1 + (LG_{PMPS} \gg LG_{PMPS_{SHIFTNO}}), s1 = s2 - 1 \end{cases}.$$

It should be noted that, because a normalization operation inevitably needs to be performed after LPS encoding, and the interval is offset to left by s2+q bits after normalization, for a value of updated $R_{LPS2}$, a factor $2^{-s2}$ may not need to be considered. Therefore, the foregoing formula may be changed to:

$$R_{LPS2} = \begin{cases} LG_{PMPS} \gg LG_{PMPS_{SHIFTNO}}, s1 = s2 \\ 1 + t1 + (LG_{PMPS} \gg LG_{PMPS_{SHIFTNO}}), s1 = s2 - 1 \end{cases}.$$

Therefore, it may be obtained that, after encoding on the LPS is completed, when a normalization operation is performed, the interval value $R_{LPS2}$ needs to be offset to left only by q bits, but a quantity of normalization operation times is still s2+q.

Figure 6:
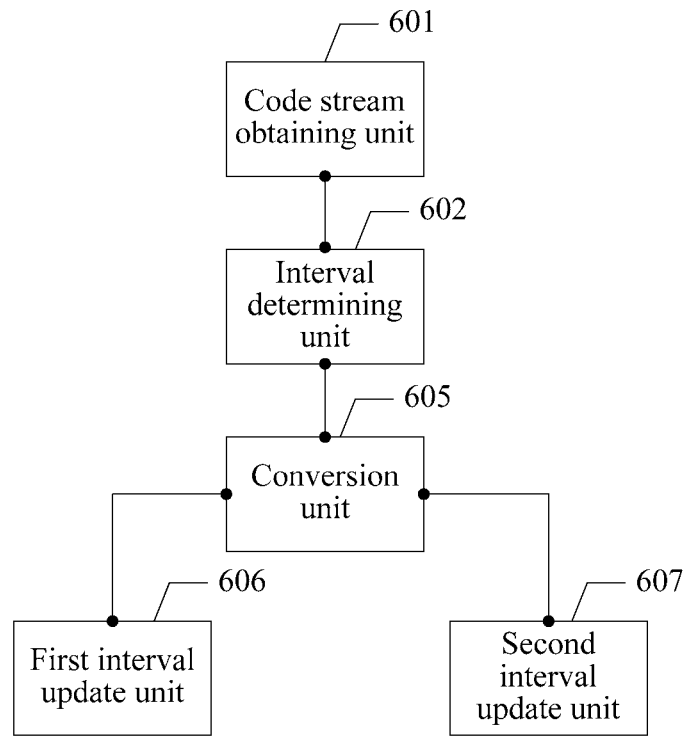
FIG. 6 is a schematic structural diagram of a data decoding apparatus according to an embodiment of the present application.

A data decoding apparatus for implementing a video data decoding method in an embodiment of the present application is described below. It should be noted that, methods recorded in embodiments of the foregoing data decoding method may be applied to the data decoding apparatus of the present application. Referring to FIG. 6, an embodiment of a data decoding apparatus in an embodiment of the present application includes:

a code stream obtaining unit 601, configured to obtain a binary code stream of image data, and initialize an arithmetic encoding interval and a code stream pointer of the binary code stream, where the code stream pointer is an offset of a lower limit value of the arithmetic encoding interval;

an interval determining unit 602, configured to determine, in a logarithm domain according to a probability of a most probable symbol (MPS) and the arithmetic encoding interval, an interval value of a first encoding interval corresponding to the MPS;

a first interval update unit 603, configured to: when the code stream pointer is greater than or equal to the value of the first encoding interval, determine that a binary symbol currently obtained by means of decoding is a least probable symbol (LPS), update an interval value of the arithmetic encoding interval to an interval value of a second encoding interval corresponding to the LPS, and update a value of the code stream pointer to a difference between the original code stream pointer and an upper limit value of the first encoding interval; and a second interval update unit 604, configured to: when the code stream pointer is less than the value of the first encoding interval, determine that a binary symbol currently obtained by means of decoding is an MPS, and update an interval value of the arithmetic encoding interval to the interval value of the first encoding interval, where the code stream pointer does not change.

Further, the apparatus further includes:

a conversion unit 605, configured to: if a current encoding interval is in the logarithm domain, before it is determined that a binary symbol currently obtained by means of decoding is a least probable symbol (LPS), or before it is determined that a binary symbol currently obtained by means of decoding is an MPS, convert the encoding interval from the logarithm domain to an original number domain, where a value of the code stream pointer and a value of the updated code stream pointer are values of the original number domain.

Specifically, the conversion unit 605 is specifically configured to:

$$R2 \approx (1+t2) >> s2, \text{ where} \quad \text{formula 10}$$

R2 is an interval value of an encoding interval corresponding to an MPS, s2 and t2 are interval information of the first encoding interval, s2 is an integer not less than the first encoding interval in the logarithm domain, and t2 is a real number less than 1 and greater than or equal to 0; and according to the formula 10, perform calculation to obtain the interval value of the first encoding interval.

Specifically, the first interval update unit 603 is specifically configured to:

$$\text{offset}_{new} = \text{offset} - R2; \text{ and} \quad \text{formula 11}$$

specifically, to satisfy a precision requirement of the formula 11, during specific calculation, expand the value R2 by s2 times, and correspondingly expand the value offset by s2 times, where offset_new is a value of the updated code stream pointer, offset is a value of the code stream pointer, and R2 is an interval value of an encoding interval corresponding to an MPS; and according to the formula 11, perform calculation to obtain a value of the updated code stream pointer.

Further, the apparatus further includes:

a determining unit 605, configured to determine the value of the first encoding interval and the value of the code stream pointer, where the value of the code stream pointer and the value of the updated code stream pointer are values of the logarithm domain.

Specifically, the first interval update unit 603 is specifically configured to:

$$\text{offset} \approx \quad \text{formula 19}$$

$$2^{-s2} \times \begin{cases} \text{value}_t - t2, & s2 = \text{value\_s} \\ 1 + (\text{vlaue}_t \ll 1) \mid \text{readbit}(1) - t2, & s2 = \text{value}_s + 1 \end{cases},$$

where offset is the code stream pointer, value_s and value_t are interval information of the code stream pointer, value_s is an integer not less than the code stream pointer in the logarithm domain, and value_t is a real number less than 1 and greater than or equal to 0; and specifically, perform a left offset operation of binary calculation on $2^{-s2}$ in the formula 19;

also perform a left offset operation of binary calculation on $2^{-s2}$ in the formula 4; and according to the formula 19, perform calculation to obtain a value of the updated code stream pointer.

Specifically, when the difference between the code stream pointer and the upper limit value of the first encoding interval is determined, the following is included:

if offset is an original number domain, updating the value of the code stream pointer according to the method of the formula 11; and if offset is a logarithm domain, updating the value of the code stream pointer according to the method of the formula 19, so as to simplify a decoding process.

Specifically, the interval determining unit is specifically configured to:

$$LG\_R2 = LG\_R1 + LG\_P_{MPS}, \text{ where} \quad \text{formula 12}$$

$LG\_P_{MPS}$ is a probability of the first encoding interval in the logarithm domain, and LG_R1 and LG_R2 are an interval value of the arithmetic encoding interval and an interval value of the first encoding interval in the logarithm domain respectively; and according to the formula 12, perform calculation to obtain the interval value of the first encoding interval corresponding to the MPS.

Further, functions of the conversion unit 605 include: before the interval value of the arithmetic encoding interval is updated to the interval value of the first encoding interval, converting the encoding interval from the original number domain to the logarithm domain.

Further, the functions of the conversion unit 605 includes: before the interval value of the arithmetic encoding interval is updated to the interval value of the first encoding interval, comparing the interval value of the first encoding interval and the value of the code stream pointer.

Operation processes of the foregoing units are described below:

The code stream obtaining unit 601 receives the binary code stream of the signal source, and initializes an arithmetic encoding interval and a code stream pointer of the binary code stream, where the code stream pointer is an offset of a lower limit value of the arithmetic encoding interval.

Specifically, the binary code stream is a binary symbol after data encoding.

The interval determining unit 602 determines, according to a probability of a most probable symbol (MPS) and the arithmetic encoding interval, an interval value of a first encoding interval corresponding to the MPS.

Specifically, the interval value of the first encoding interval corresponding to the MPS may be obtained by means of calculation according to formula 12.

$$LG\_R2 = LG\_R1 + LG_{MPS}, \text{ where} \quad \text{formula 12}$$

$LG\_P_{MPS}$ is a probability of the first encoding interval in the logarithm domain, and LG_R1 and LG_R2 are an interval value of the arithmetic encoding interval and an interval value of the first encoding interval in the logarithm domain respectively.

Whether the code stream pointer is less than the interval value of the first encoding interval is determined. If the code stream pointer is less than the interval value of the first encoding interval, the first interval update unit 603 performs execution; or if the code stream pointer is not less than the interval value of the first encoding interval, the second interval update unit 604 performs execution.

Specifically, if a current encoding interval is a logarithm domain, the encoding interval is converted from the logarithm domain to an original number domain according to a method for approximate conversion between a logarithm and an original number. A value to which the code stream pointer points is an offset of a lower limit value of the arithmetic encoding interval in the original number domain.

When the code stream pointer is less than the interval value of the first encoding interval, the first interval update unit 603 determines that a binary symbol currently obtained by means of decoding is an MPS, and updates an interval value of the arithmetic encoding interval to the interval value of the first encoding interval, where the code stream pointer does not change.

Optionally, before the interval value of the arithmetic encoding interval is updated to the interval value of the first encoding interval, the encoding interval may be converted from the original number domain to the logarithm domain.

Optionally, after update on the first encoding interval is completed, it is determined whether normalization processing needs to be performed on the first encoding interval. If the updated first encoding interval is less than one half of the arithmetic encoding interval, normalization processing is performed on the first encoding interval in the logarithm domain.

In this embodiment of the present application, after the first encoding interval is updated at least twice, the first encoding interval may be less than one half of the arithmetic encoding interval. When the first encoding interval is less than one half of the arithmetic encoding interval, normalization processing needs to be performed on the first encoding interval.

Specifically, the probability of the MPS is greater than 0.5. Therefore, after normalization is performed once (that is, the original encoding interval is doubled), the precision requirement of the encoding interval may be satisfied.

For example, specific normalization calculation may be implemented according to a formula 6.

The formula 6 is:

$$LG\_R2_{(2)}=LG\_R2_{(1)}-1, \text{ where}$$

$LG\_R2_{(2)}$ is an interval value of the normalized first encoding interval in the logarithm domain, and $LG\_R2_{(1)}$ is an interval value of the first encoding interval in the logarithm domain before normalization.

If a current encoding interval is in the logarithm domain, before it is determined that a binary symbol currently obtained by means of decoding is a least probable symbol (LPS), or before it is determined that a binary symbol currently obtained by means of decoding is an MPS, the conversion unit 605 converts the encoding interval from the logarithm domain to an original number domain, where a value of the code stream pointer and a value of the updated code stream pointer are values of the original number domain.

If a current encoding interval is in the logarithm domain, before it is determined that a binary symbol currently obtained by means of decoding is a least probable symbol (LPS) or before it is determined that a binary symbol currently obtained by means of decoding is an MPS, the determining unit 605 may determine an interval value of the first encoding interval and a value of the code stream pointer, where the value of the code stream pointer and the value of the updated code stream pointer are values of the logarithm domain.

When the code stream pointer is greater than or equal to the interval value of the first encoding interval, the second interval update unit 604 determines that a binary symbol currently obtained by means of decoding is a least probable symbol (LPS), switches the encoding interval to the original number domain, updates an interval value of the arithmetic encoding interval to an interval value of a second encoding interval corresponding to the LPS, and updates a value of the code stream pointer to a difference between the original code stream pointer and an upper limit value of the first encoding interval.

Specifically, for a method for updating a value of the code stream pointer to a difference between the original code stream pointer and an upper limit value of the first encoding interval, refer to formula 11:

$$\text{offset}_{new}=\text{offset}-R2; \qquad \text{formula 11}$$

specifically, to satisfy a precision requirement of the formula 11, during specific calculation, the value R2 is expanded by s2 times, and the value offset is correspondingly expanded by s2 times; and offset_new is a value of the updated code stream pointer, offset is a value of the code stream pointer, and R2 is an interval value of an encoding interval corresponding to an MPS.

Specifically, if a current encoding interval is a logarithm domain, the encoding interval is converted from the logarithm domain to an original number domain according to a method for approximate conversion between a logarithm and an original number.

Specifically, for a method for updating a value of the code stream pointer to a difference between the original code stream pointer and an upper limit value of the first encoding interval, refer to formula 19:

$$\text{offset} \approx 2^{-s2} \times \begin{cases} \text{value}_t - t2, & s2 = \text{value\_s} \\ 1+(\text{vlaue}_t \ll 1) \mid \text{readbit}(1)-t2, & s2 = \text{value}_s+1 \end{cases},$$

where offset is the code stream pointer, value_s and $\text{value}_t$ are interval information of the code stream pointer, value_s is an integer not less than the code stream pointer in the logarithm domain, and $\text{value}_t$ is a real number less than 1 and greater than or equal to 0;

specifically, a left offset operation of binary calculation is performed on $2^{-s2}$ in the formula 19; and a left offset operation of binary calculation is also performed on $2^{-s2}$ in the formula 4.

Specifically, when the difference between the code stream pointer and the upper limit value of the first encoding interval is determined, the following is included:

if offset is an original number domain, updating the value of the code stream pointer according to the method of the formula 11; and if offset is a logarithm domain, updating the value of the code stream pointer according to the method of the formula 19, so as to simplify a decoding process.

Specifically, the current interval value of the arithmetic encoding interval is R1, the current offset is offset, $p_{LPS}$ denotes a probability of an LPS, $p_{MPS}$ denotes a probability of an MPS, and $p_{LPS}+p_{MPS}=1$. The value RLPS and the value offset of the interval are updated as follows:

$$R_{LPS}=R1-R1\times p_{MPS};\text{ and}$$

$$\text{offset}_{n+1}=\text{offset}_n\times p_{MPS}$$

Optionally, after update on the second encoding interval is completed, the probability of the LPS is less than 0.5. Therefore, normalization processing needs to be performed at least more than once after update.

Specifically, the lower limit value of the encoding interval of the LPS is the upper limit value of the first encoding interval. Therefore, when update or a normalization operation is performed on the second encoding interval, the value offset needs to be updated according to the upper limit value of the first encoding interval.

Specifically, the interval value of the second encoding interval converted to the original number domain is denoted by using 2 to the power of X. Therefore, when a computer performs normalization calculation, shift calculation may be performed in a binary manner.

Optionally, for convenience of updating the first encoding interval for the MPS subsequently, the interval value updated in the original number domain may be converted to the logarithm domain. This is specifically implemented by using the formula 7.

Specifically, a left offset operation of binary calculation is performed on $2^{-s2}$ in the formula 19; and a left offset operation of binary calculation is also performed on $2^{-s2}$ in the formula 4.

In this embodiment of the present application, after a binary code stream of a signal source is received, whether the binary symbol is an MPS or an LPS is confirmed, and when it is confirmed that the binary symbol is an MPS, arithmetic encoding is performed in a logarithm domain. MPS interval update is performed by using a logarithm, so that a multiplication operation is replaced with an addition operation during calculation. When it is confirmed that the binary symbol is an LPS, arithmetic encoding is performed in an original number domain.

In the prior art, the value offset is denoted by using information offset_s and offset_t in a logarithm domain. In this way, during LPS decoding, conversion from the logarithm domain to an original number domain needs to be performed, and after LPS decoding, conversion from the original number domain to the logarithm domain needs to be performed. This frequent conversion operation does not facilitate implementation of a hardware arithmetic decoder, and when an offset precision is very high, the implementation is more difficult. In this embodiment of the present application, because the offset is always in the original number domain, the frequent conversion operation is avoided, thereby facilitating hardware implementation.

Optionally, in a decoding process in the logarithm domain of this embodiment of the present application, another embodiment of the data decoding apparatus in this embodiment of the present application may include:

The code stream obtaining unit 601 receives the binary code stream of the signal source, and initializes an arithmetic encoding interval and a code stream pointer of the binary code stream, where the code stream pointer is an offset of a lower limit value of the arithmetic encoding interval.

Specifically, the binary code stream is a binary symbol after data encoding.

In this embodiment of the present application, the data decoding apparatus is a device that has a data decoding function in this embodiment of the present application, may specifically be a single physical device, including multiple physical modules, or may be a software program loaded into a computer, or a function module in software, or exist in a form of independent software or in a form of plug-in.

The interval determining unit 602 determines an interval value of a first encoding interval corresponding to the MPS.

In the logarithm domain, the interval determining unit 602 determines, according to a probability of a most probable symbol (MPS) and the arithmetic encoding interval, an interval value of a first encoding interval corresponding to the MPS.

Specifically, an interval value of the encoding interval corresponding to the MPS in the logarithm domain satisfies the following formula 7:

$$LG\_R2=LG\_R1+LG\_P_{MPS},\text{ where} \qquad \text{formula 7}$$

$LG\_P_{MPS}$ is a probability of the first encoding interval in the logarithm domain, and LG_R1 and LG_R2 are an interval value of the arithmetic encoding interval and an interval value of the first encoding interval in the logarithm domain respectively; and according to the formula 7, the interval value of the first encoding interval corresponding to the MPS is obtained by means of calculation.

Further, an interval value of the first encoding interval in an original number domain may be determined by means of approximate calculation.

The interval value of the first encoding interval corresponding to the MPS in the original number domain is determined according to s2 and t2 of the first encoding interval corresponding to the MPS in the logarithm domain by means of approximate calculation.

Specifically, an interval value of the encoding interval corresponding to the MPS in the logarithm domain satisfies the following formula 10:

$$R2\approx(1+t2)>>s2,\text{ where} \qquad \text{formula 11}$$

R2 is an interval value of an encoding interval corresponding to an MPS, s2 and t2 are interval information of the first encoding interval, s2 is an integer not less than the first encoding interval in the logarithm domain, and t2 is a real number less than 1 and greater than or equal to 0.

Whether the interval value of the first encoding interval is less than the code stream pointer is determined.

The data decoding apparatus determines whether the code stream pointer is less than the interval value of the first encoding interval. If the code stream pointer is less than the interval value of the first encoding interval, the first interval update unit 603 performs execution; or if the code stream pointer is not less than the interval value of the first encoding interval, the second interval update unit 604 performs execution.

Specifically, determining is performed according to offset and the value R2 in the formula 10. A value to which the code stream pointer offset points is an offset of a lower limit value of the arithmetic encoding interval in the original number domain.

The first interval update unit 603 updates an interval value of the arithmetic encoding interval to the interval value of the first encoding interval.

If the code stream pointer is less than the interval value of the first encoding interval in the logarithm domain, it is determined that a binary symbol currently obtained by means of decoding is an MPS, and the interval value of the arithmetic encoding interval is updated to the interval value of the first encoding interval, where the code stream pointer does not change.

The second interval update unit 604 updates a value of the code stream pointer to a difference between the code stream pointer and an upper limit value of the first encoding interval.

If the code stream pointer is greater than or equal to the interval value of the first encoding interval in the logarithm domain, it is determined that a binary symbol currently obtained by means of decoding is a least probable symbol (LPS), the encoding interval is switched to the original number domain, an interval value of the arithmetic encoding interval is updated to an interval value of a second encoding interval corresponding to the LPS, and a value of the code stream pointer is updated to the code stream pointer minus an upper limit value of the first encoding interval.

Specifically, the switching the encoding interval to the original number domain, and updating an interval value of the arithmetic encoding interval to an interval value of a second encoding interval corresponding to the LPS includes:

A sub-interval RLPS corresponding to the LPS has a value of R1-R2. Therefore, the following is obtained by means of derivation during encoding:

$$R_{LPS} \approx 2^{-s2} \times \begin{cases} t1 - t2, s2 = s1 \\ 1 + (t1 \ll 1) - t2, s2 = s1 + 1 \end{cases}.$$

When s2=s1, t1-t2=LG_$P_{MPS}$; when s2=s1+1, 1+t1-t2=LG_$P_{MPS}$. Therefore, the following formula 4 may be obtained by means of derivation according to the foregoing formula:

$$R_{LPS} = 2^{-s2} \times \begin{cases} LG_{PMPS}, s1 = s2 \\ 1 + t1 + LG_{PMPS}, s1 = s2 - 1 \end{cases}, \quad \text{formula 4}$$

where

RLPS is an interval value of the updated second encoding interval in the original number domain, LG_$P_{MPS}$ is a probability of the first encoding interval in the logarithm domain, s1 and t1 are interval information of the arithmetic encoding interval, s2 and t2 are interval information of the first encoding interval, s1 is an integer not less than the arithmetic encoding interval in the logarithm domain, s2 is an integer not less than the first encoding interval in the logarithm domain, and t1 and t2 are both real numbers less than 1 and greater than or equal to 0.

According to the formula 4, the interval value of the updated second encoding interval in the original number domain is obtained by means of calculation.

Optionally, for convenience of updating the first encoding interval for the MPS subsequently, the interval value updated in the original number domain may be converted to the logarithm domain. This is specifically implemented by using the formula 7.

Specifically, for the updating a value of the code stream pointer to the code stream pointer minus an upper limit value of the first encoding interval, refer to a formula 10 and a formula 11:

$$R2 \approx (1+t2) \gg s2; \text{ and} \quad \text{formula 10}$$

$$\text{offset}_{new} = \text{offset} - R2, \text{ where} \quad \text{formula 11}$$

offset_new is the updated code stream pointer, offset is the value of the code stream pointer, R2 is an interval value of an encoding interval corresponding to an MPS, s2 and t2 are interval information of the first encoding interval, s2 is an integer not less than the first encoding interval in the logarithm domain, and t2 is a real number less than 1 and greater than or equal to 0.

According to the formula 11, a value of the updated code stream pointer is obtained by means of calculation.

In an actual application, RLPS and offset are both offset to left. Therefore, the same factor $2^{-s2}$ may be not taken into account. Specifically, during data decoding, code executed by a computer when updating an encoding interval may be:

First, offset to left is performed, so that a most significant bit of range is '1'
while (RLPS<0x100) {
RLPS=RLPS<<1;
Offset=(offset<<1)|readbit(1);
}

After completion, integral and decimal parts of LG_$R_1$ are updated:
s1=0; and
t1=low eight bits of RLPS.

Specifically, for the updating a value of the code stream pointer to the code stream pointer minus an upper limit value of the first encoding interval, refer to a formula 10 and a formula 19:

$$\text{offset} \approx 2^{-s2} \times \begin{cases} \text{value}_t - t2, s2 = \text{value}\_s \\ 1 + (vlaue_t \ll 1) | readbit(1) - t2, s2 = \text{value}_s + 1 \end{cases},$$

where offset is the code stream pointer, value_s and value_$t$ are interval information of the code stream pointer, value_s is an integer not less than the code stream pointer in the logarithm domain, and value_$t$ is a real number less than 1 and greater than or equal to 0;

specifically, a left offset operation of binary calculation is performed on $2^{-s2}$ in the formula 19; and a left offset operation of binary calculation is also performed on $2^{-s2}$ in the formula 4.

According to the formula 19, a value of the updated code stream pointer is obtained by means of calculation.

In an actual application, RLPS and offset are both offset to left. Therefore, the same factor $2^{-s2}$ may be not taken into account. Specifically, during data decoding, code executed by a computer when updating an encoding interval may be:

First, offset to left is performed, so that a most significant bit of range is '1'
while (RLPS<0x100) {
RLPS=RLPS<<1;
Offset=(offset<<1)|readbit(1);
} where readbit (1) denotes that content of one bit is read from a code stream and a value of readbit (1) is determined according to the read content of the bit, for example, if a bit '1' is read from readbit (1), the value of readbit (1) is one; otherwise, if a bit '0' is read from readbit (1), the value of readbit (1) is 0.

After completion, integral and decimal parts of LG_$R_1$ are updated:
s1=0; and
t1=low eight bits of RLPS.

Specifically, when the difference between the code stream pointer and the upper limit value of the first encoding interval is determined, the following is included:

if offset is an original number domain, updating the value of the code stream pointer according to the method of the formula 11; and if offset is a logarithm domain, updating the value of the code stream pointer according to the method of the formula 19, so as to simplify a decoding process.

Figure 7:
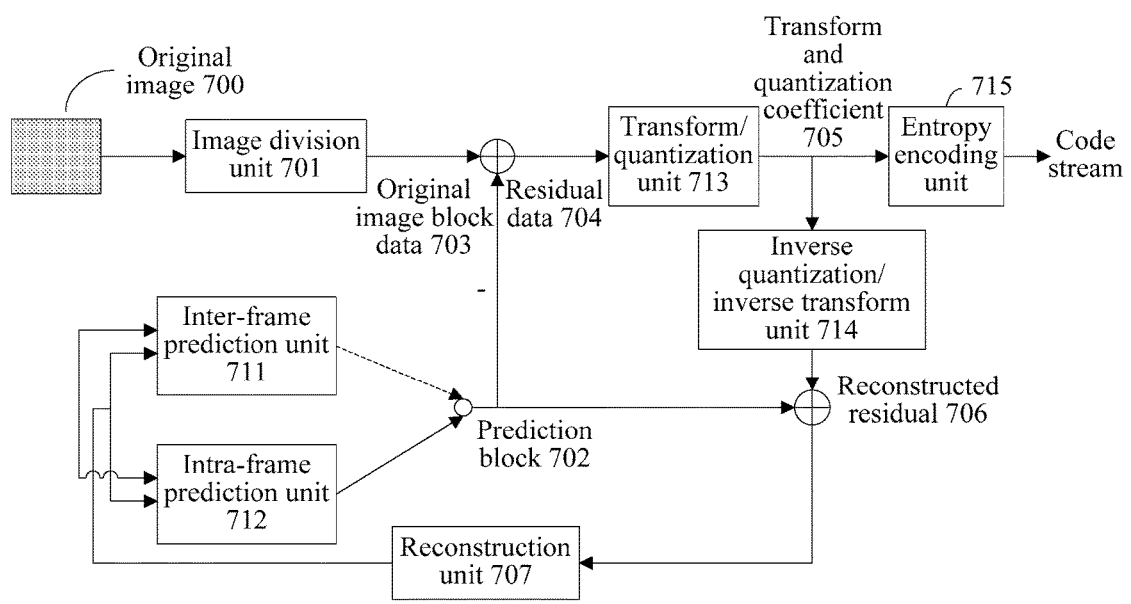
FIG. 7 is a schematic architectural diagram of encoding implementation according to an embodiment of the present application.

FIG. 7 is a flowchart of encoding of an encoding end according to an embodiment of the present application. The encoding end is generally an encoding apparatus, for example, an encoder, or may be a device integrating the encoding apparatus, for example, a mobile terminal. The data encoding apparatus in this embodiment of the present application is implemented in an entropy encoding unit in FIG. 7.

First, an original image captured by a video capture device (not shown in the figure) is input to an encoding apparatus shown in FIG. 7. The input original image 700 is divided by an image division unit 701 into multiple pieces of original image block data 703 that do not overlap. A current operated object is referred to as a current encoding block, the current encoding block may further continue to be divided into sub-image blocks (original sub-image blocks), this division method is commonly known, and details are not described herein. It should be noted that, before being input to the image division unit, the input original image may be further subjected to pre-processing, for example, filtering processing, but this is not necessary. It is assumed that a size of the sub-image block obtained by means of division is N*N, it indicates that the block is a two-dimensional pixel array of N rows multiplied by N columns, and has a size of N pixels in both horizontal and vertical directions, where N is a positive integer. For example, N may be equal to 2 to the power of x, and x is a natural number. It should be particularly noted that, division may be further performed in a manner of 2N*N or N*2N.

The encoding end performs a prediction operation on the original sub-image block to obtain a prediction block 702 of original image block data (original image pixel) of the original sub-image block. The prediction operation may be generally divided into inter-frame prediction and intra-frame prediction, where the inter-frame prediction is performed by an inter-frame prediction unit 711, and the intra-frame prediction is performed by an intra-frame prediction unit 712. After the original sub-image block and the prediction block corresponding to the original image block data are obtained, a pixel difference between the original image block data 703 and the prediction block 702 is further calculated, to obtain residual data 704 of the encoding block, and the residual data is input to a transform/quantization unit 713. The transform/quantization unit 713 performs transform and quantization operations on the residual data to obtain a conversion transform coefficient 705 of the current block after transform and quantization, and specific methods for transform and quantization are commonly known, and are not repeated herein. The transform coefficient 705 of the current block after transform and quantization is sent to an entropy encoding apparatus 715 of the present application for processing. The entropy encoding apparatus 715 scans (for example, zigzags) the transform coefficient 705 of the current block after transform and quantization to obtain a one-dimensional sequence of the current block, then performs a binarization operation to obtain a binary code stream. Additionally, the transform and quantization coefficient 705 after transform and quantization is processed by an inverse quantization and inverse transform unit 714 to obtain a reconstructed residual 706, and a so-called inverse quantization and inverse transform operation is generally an operation reverse to quantization and transform. Then, the reconstructed residual 706 is added to the prediction value of the prediction block 702 of the current encoding block to obtain image block reconstruction data of the block, the image block reconstruction data is transferred to a reconstruction unit 707, and the reconstruction unit 707 may include a storage apparatus, configured to store the image block reconstruction data. The reconstruction unit 707 of the current block is configured to predict a subsequent encoding block, and the subsequent encoding block may be a to-be-processed encoding block in a current encoded image, or may be an encoding block in a subsequent to-be-encoded image.

A decoding end needs to reconstruct the encoded image block to restore the original image. During reconstruction, entropy decoding needs to be first performed on data received by a decoder, data after entropy decoding is inversely scanned to obtain a reconstructed transform and quantization coefficient, and the reconstructed transform and quantization coefficient is subjected to operations such as inverse quantization, inverse transform, prediction, and reconstruction to obtain image block reconstruction data. The foregoing steps correspond to steps at the encoding end, so as to obtain a decoded image. The decoding end may be a video decoder, and the video decoder may be integrated into a mobile terminal.

In the several embodiments provided in this application, it should be understood that the disclosed apparatus and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present application essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in the embodiments of the present application. The foregoing storage medium includes: any medium that can store program code, such as a Universal Serial Bus (USB) flash drive, a removable hard disk, a read-only memory (ROM), a random access memory (RAM), a magnetic disk, or an optical disc.

The foregoing descriptions are merely specific implementation manners of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

The foregoing descriptions are merely specific implementation manners of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims. Additionally, statements made herein characterizing the invention or the present application refer to an embodiment of the invention or the present application and not necessarily all embodiments.

What is claimed is:

1. A video data decoding method utilising arithmetic encoding, comprising:
    obtaining, by a data decoding apparatus, a binary code stream of image data, and initializing an arithmetic encoding interval and a code stream pointer of the binary code stream, wherein the code stream pointer is an offset of a lower limit value of the arithmetic encoding interval;
    determining, by the data decoding apparatus, in a logarithm domain according to a probability of a most probable symbol (MPS) and the arithmetic encoding interval, an interval value of a first encoding interval corresponding to the MPS; and
    when the code stream pointer is greater than or equal to the interval value of the first encoding interval, determining, by the data decoding apparatus, that a current decoded binary symbol is a least probable symbol (LPS), updating an interval value of the arithmetic encoding interval to an interval value of a second encoding interval corresponding to the LPS, and updating a value of the code stream pointer to a difference between an original value of the code stream pointer and an upper limit value of the first encoding interval; or when the code stream pointer is less than the interval value of the first encoding interval, determining, by the data decoding apparatus, that a current decoded binary symbol is an MPS, and updating an interval value of the arithmetic encoding interval to the interval value of the first encoding interval, wherein the code stream pointer does not change;
    wherein if a current encoding interval is in the logarithm domain, the method further comprises: before determining that the current decoded binary symbol is an LPS or an MPS, converting the encoding interval from the logarithm domain to an original number domain, wherein the value of the code stream pointer and the updated value of the code stream pointer are values of the original number domain; and
    wherein converting the encoding interval from the logarithm domain to the original number domain comprises:
        performing a calculation to obtain the interval value of the first encoding interval according to formula 10: R2≈(1=t2)»s2;

wherein R2 is an interval value of an encoding interval corresponding to an MPS, s2 and t2 are interval information of the first encoding interval, s2 is an integer not less than the first encoding interval in the logarithm domain, and t2 is a real number less than 1 and greater than or equal to 0.

2. The method according to claim 1, wherein converting the encoding interval from the logarithm domain to the original number domain comprises:
    when the arithmetic encoding interval is denoted by nine bits and t2 is denoted by an eight-bit precision, performing a calculation to obtain the updated value of the second encoding interval according to formula 11: R2≈(256+t2)>>s2;
    wherein R2 is a value of the first encoding interval, s2 and t2 are interval information of the first encoding interval, and s2 is an integer not less than the first encoding interval in the logarithm domain, and t2 is a real number less than 1 and greater than or equal to 0.

3. The method according to claim 1, wherein updating the value of the code stream pointer to the difference between the original value of the code stream pointer and the upper limit value of the first encoding interval comprises:
    performing a calculation to obtain a value of the updated code stream pointer according to formula 11: offset$_{new}$=offset−R2;
    wherein offset$_{new}$ is a value of the updated code stream pointer, offset is a value of the code stream pointer, and R2 is an interval value of an encoding interval corresponding to an MPS.

4. The method according to claim 1, wherein updating the value of the code stream pointer to the difference between the original value of the code stream pointer and the upper limit value of the first encoding interval comprises:
    performing a calculation to obtain a value of the updated code stream pointer according to formula 19:

$$\text{offset} \approx 2^{-s2} \times \begin{cases} \text{value}_t - t2, s2 = \text{value}_s \\ 1 + (\text{value}_t \ll 1) \,|\, readbit(1) - t2, s2 = \text{value}_s + 1 \end{cases};$$

wherein offset is the code stream pointer, value$_s$ and value$_t$ are interval information of the code stream pointer, value$_s$ is an integer not less than the code stream pointer in the logarithm domain, and value$_t$ is a real number less than 1 and greater than or equal to 0; and s2 is interval information of the first encoding interval, s2 is an integer not less than the first encoding interval in the logarithm domain, and t2 is a real number less than 1 and greater than or equal to 0.

5. The method according to claim 4, wherein updating the value of the code stream pointer to the difference between the original value of the code stream pointer and the upper limit value of the first encoding interval comprises:
    when the arithmetic encoding interval is denoted by nine bits, and t2 is denoted by an eight-bit precision, updating the value of the code stream pointer to the difference between the original value of the code stream pointer and the upper limit value of the first encoding interval according to:
    if s2=value$_s$, Offset=value$_t$−t2; or
    if s2=value$_s$+1, Offset=1+((value$_t$<<1)|readbit(1))−t2, wherein symbol "|" denotes an operation "or" in mathematics; and
    performing a left offset operation of binary calculation on $2^{-s2}$ in the formula 19.

6. The method according to claim 1, wherein determining the interval value of the first encoding interval corresponding to the MPS comprises:

performing a calculation to obtain the interval value of the first encoding interval corresponding to the MPS according to: LG_R2=LG_R1+LG_P$_{MPS}$;

wherein LG_P$_{MPS}$ is a probability of the first encoding interval in the logarithm domain, and LG_R1 and LG_R2 are an interval value of the arithmetic encoding interval and an interval value of the first encoding interval in the logarithm domain, respectively.

7. The method according to claim 1, wherein before updating the interval value of the arithmetic encoding interval to the interval value of the first encoding interval, the method comprises:

converting the encoding interval from an original number domain to the logarithm domain.

8. A data encoding apparatus, comprising:

a non-transitory memory having processor-executable instructions stored thereon; and a processor, coupled to the memory, configured to execute the processor-executable instructions to facilitate:

obtaining a binary symbol of image data; and if the binary symbol is a most probable symbol (MPS), updating a first encoding interval corresponding to the MPS in a logarithm domain; and if the updated first encoding interval is less than a preset range of an arithmetic encoding interval, performing normalization processing on the first encoding interval in the logarithm domain; and if the binary symbol is a least probable symbol (LPS), updating a second encoding interval corresponding to the LPS in an original number domain; and performing normalization processing on the second encoding interval in the original number domain;

wherein the processor is further configured to execute the processor-executable instructions to facilitate:

if a current encoding interval is a logarithm domain, converting the current encoding interval from the logarithm domain to an original number domain according to a method for approximate conversion between a logarithm and an original number;

wherein the processor is further configured to execute the processor-executable instructions to facilitate:

separately determining an interval value of the arithmetic encoding interval and an interval value of the first encoding interval in the original number domain according to the method for approximate conversion between a logarithm and an original number, interval information of the arithmetic encoding interval, and interval information of the first encoding interval according to formula 1:

$$\begin{cases} R1 = 2^{-s1+t1} \approx (1+t1) \gg s1 \\ R2 = 2^{-s2+t2} \approx (1+t2) \gg s2 \end{cases};$$

and determining an interval value of the updated second encoding interval according to the interval value of the arithmetic encoding interval and the interval value of the first encoding interval in the original number domain according to formula 2:

$$R_{LPS1} = 2^{-s2} \times \begin{cases} t1-t2, s1=s2 \\ 1+(t1 \ll 1)-t2, s1=s2-1 \end{cases};$$

wherein R1 and R2 are the interval value of the arithmetic encoding interval and the interval value of the first encoding interval in the original number domain, respectively, s1 and t1 are the interval information of the arithmetic encoding interval, s2 and t2 are the interval information of the first encoding interval, s1 is an integer not less than the arithmetic encoding interval in the logarithm domain, s2 is an integer not less than the first encoding interval in the logarithm domain, and t1 and t2 are both real numbers less than 1 and greater than or equal to 0; and R$_{LPS1}$ is an interval value of the second encoding interval before update in the original number domain.

9. The apparatus according to claim 8, wherein the processor is further configured to execute the processor-executable instructions to facilitate:

if a current encoding interval is an original number domain, converting the current encoding interval from the original number domain to a logarithm domain according to a method for approximate conversion between a logarithm and an original number.

10. The apparatus according to claim 8, wherein the processor is further configured to execute the processor-executable instructions to facilitate:

determining an interval value of the updated second encoding interval according to a probability of the first encoding interval, interval information of the arithmetic encoding interval, and interval information of the first encoding interval.

11. The apparatus according to claim 8, wherein the processor is further configured to execute the processor-executable instructions to facilitate:

determining a lower limit value of the updated second encoding interval according to an interval value of the first encoding interval.

12. The apparatus according to claim 8, wherein the processor is further configured to execute the processor-executable instructions to facilitate:

determining an arithmetic expression of LG_P$_{MPS}$ according to the interval information of the arithmetic encoding interval and the interval information of the first encoding interval according to formula 3: LG_P$_{MPS}$=LG_R1−LG_R2=s1−t1−s2+t2; and perform conversion with reference to the formula 2 and the formula 3, to obtain an interval value of the updated second encoding interval according to formula 4:

$$R_{LPS2} = 2^{-s2} \times \begin{cases} LG\_P_{MPS}, s1=s2 \\ 1+t1+LG\_P_{MPS}, s1=s2-1 \end{cases};$$

wherein LG_P$_{MPS}$ is a probability of the first encoding interval in the logarithm domain, and LG_R1 and LG_R2 are an interval value of the arithmetic encoding interval and an interval value of the first encoding interval in the logarithm domain, respectively; and R$_{LPS2}$ is an interval value of the updated second encoding interval in the original number domain.

13. The apparatus according to claim 11, wherein the processor is further configured to execute the processor-executable instructions to facilitate:

obtaining an interval value of the updated second encoding interval according to the method for approximate conversion between a logarithm and an original number according to formula 5: $low2=low1+R2=low+2^{-s2+t2}\approx low1+(1+t2)\gg s2$, wherein low2 is a lower limit value of the updated second encoding interval in the original number domain, low1 is a lower limit value of the second encoding interval before update in the original number domain, and R2 is an interval value of the first encoding interval in the original number domain.

14. A data decoding apparatus, comprising:

a non-transitory memory having processor-executable instructions stored thereon; and a processor, coupled to the memory, configured to execute the processor-executable instructions to facilitate:

obtaining a binary code stream of image data, and initializing an arithmetic encoding interval and a code stream pointer of the binary code stream, wherein the code stream pointer is an offset of a lower limit value of the arithmetic encoding interval;

determining, in a logarithm domain according to a probability of a most probable symbol (MPS) and the arithmetic encoding interval, an interval value of a first encoding interval corresponding to the MPS;

when the code stream pointer is greater than or equal to the interval value of the first encoding interval, determining that a current decoded binary symbol is a least probable symbol (LPS), updating an interval value of the arithmetic encoding interval to an interval value of a second encoding interval corresponding to the LPS, and updating a value of the code stream pointer to a difference between an original value of the code stream pointer and an upper limit value of the first encoding interval; and when the code stream pointer is less than the interval value of the first encoding interval, determining that a current decoded binary symbol is an MPS, and updating an interval value of the arithmetic encoding interval to the interval value of the first encoding interval, wherein the code stream pointer does not change;

wherein the processor is further configured to execute the processor-executable instructions to facilitate: if a current encoding interval is in the logarithm domain, before determining that the current decoded binary symbol is an LPS or an MPS, converting the encoding interval from the logarithm domain to an original number domain, wherein the value of the code stream pointer and the updated value of the code stream pointer are values of the original number domain;

wherein converting the encoding interval from the logarithm domain to the original number domain comprises:

performing a calculation to obtain the interval value of the first encoding interval according to formula 10: $R2\approx(1+t2)\gg s2$;

wherein R2 is an interval value of an encoding interval corresponding to an MPS, s2 and t2 are interval information of the first encoding interval, s2 is an integer not less than the first encoding interval in the logarithm domain, and t2 is a real number less than 1 and greater than or equal to 0.

* * * * *